(12) United States Patent
Flynn et al.

(10) Patent No.: US 8,307,258 B2
(45) Date of Patent: Nov. 6, 2012

(54) APPARATUS, SYSTEM, AND METHOD FOR RECONFIGURING AN ARRAY TO OPERATE WITH LESS STORAGE ELEMENTS

(75) Inventors: David Flynn, Sandy, UT (US); Jonathan Thatcher, Lehi, UT (US); Joshua Aune, South Jordan, UT (US); Jeremy Fillingim, Salt Lake City, UT (US); Bill Inskeep, West Valley City, UT (US); John Strasser, Syracuse, UT (US); Kevin Vigor, Salt Lake City, UT (US)

(73) Assignee: Fusion-10, Inc, Salt Lake City, UT (US)

( * ) Notice: Subject to any disclaimer, the term of this patent is extended or adjusted under 35 U.S.C. 154(b) by 528 days.

(21) Appl. No.: 12/468,040

(22) Filed: May 18, 2009

(65) Prior Publication Data

US 2010/0293439 A1    Nov. 18, 2010

(51) Int. Cl.
*G11C 29/00* (2006.01)

(52) U.S. Cl. ........ 714/763; 714/6; 365/185.09; 365/201

(58) Field of Classification Search .............. 714/6, 763; 365/185.09, 201
See application file for complete search history.

(56) References Cited

U.S. PATENT DOCUMENTS

| | | | |
|---|---|---|---|
| 4,740,968 A | 4/1988 | Aichelmann, Jr. | |
| 5,208,813 A | 5/1993 | Stallmo | |
| 5,233,618 A | 8/1993 | Glider et al. | |
| 5,261,068 A | 11/1993 | Gaskins et al. | |
| 5,265,098 A | 11/1993 | Mattson et al. | |
| 5,390,187 A | 2/1995 | Stallmo | |
| 5,404,485 A | 4/1995 | Ban | |
| 5,438,671 A | 8/1995 | Miles | |
| 5,479,653 A | 12/1995 | Jones | |
| 5,488,701 A | 1/1996 | Brady et al. | |
| 5,553,231 A | 9/1996 | Papenberg et al. | |
| 5,581,567 A | 12/1996 | Chen et al. | |
| 5,581,690 A | 12/1996 | Ellis et al. | |

(Continued)

FOREIGN PATENT DOCUMENTS

EP    0569236 A2    11/1993

(Continued)

OTHER PUBLICATIONS

PCT/US2009/044414 International Preliminary Report on Patentability, Nov. 25, 2010.

(Continued)

*Primary Examiner* — Esaw Abraham
(74) *Attorney, Agent, or Firm* — Kunzler Law Group, PC

(57) ABSTRACT

An apparatus, system, and method are disclosed for reconfiguring an array of solid-state storage elements protected using parity data. The storage element error module determines that one or more storage elements are unavailable to store data ("unavailable storage elements"). The storage element resides in an array with N number of storage elements storing a first ECC chunk and P number of storage elements storing first parity data. The reconfigure data read module reads data from storage elements other than the unavailable storage elements. The data regeneration module uses the first parity data to regenerate missing data from the first ECC chunk. The data reconfiguration module creates a second ECC chunk. The new configuration storage module stores a portion of the second ECC chunk and associated second parity data on (N+P)−Z number of storage elements, wherein $1 \leq Z \leq P$.

21 Claims, 22 Drawing Sheets

U.S. PATENT DOCUMENTS

| | | | |
|---|---|---|---|
| 5,596,708 A | 1/1997 | Weber |
| 5,701,434 A | 12/1997 | Nakagawa |
| 5,729,497 A | 3/1998 | Pawlowski |
| 5,740,188 A | 4/1998 | Olarig |
| 5,754,567 A | 5/1998 | Norman |
| 5,799,140 A | 8/1998 | Niijima et al. |
| 5,819,109 A | 10/1998 | Davis |
| 5,835,935 A | 11/1998 | Estakhri et al. |
| 5,841,795 A | 11/1998 | Olarig et al. |
| 5,845,329 A | 12/1998 | Onishi et al. |
| 5,922,080 A | 7/1999 | Olarig |
| 5,960,462 A | 9/1999 | Solomon et al. |
| 5,974,502 A | 10/1999 | DeKoning et al. |
| 5,978,953 A | 11/1999 | Olarig |
| 6,000,006 A | 12/1999 | Bruce et al. |
| 6,000,019 A | 12/1999 | Dykstal et al. |
| 6,003,144 A | 12/1999 | Olarig et al. |
| 6,024,486 A | 2/2000 | Olarig et al. |
| 6,070,249 A | 5/2000 | Lee |
| 6,079,029 A | 6/2000 | Iwatani et al. |
| 6,158,017 A | 12/2000 | Han et al. |
| 6,170,037 B1 | 1/2001 | Blumenau |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,219,807 B1 | 4/2001 | Ebihara et al. |
| 6,223,301 B1 | 4/2001 | Santeler et al. |
| 6,233,717 B1 | 5/2001 | Choi |
| 6,279,138 B1 | 8/2001 | Jadav et al. |
| 6,282,671 B1 | 8/2001 | Islam et al. |
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,412,080 B1 | 6/2002 | Fleming et al. |
| 6,418,478 B1 | 7/2002 | Ignatius et al. |
| 6,430,702 B1 | 8/2002 | Santeler et al. |
| 6,523,102 B1 | 2/2003 | Dye et al. |
| 6,557,123 B1 | 4/2003 | Wiencko, Jr. et al. |
| 6,587,915 B1 | 7/2003 | Kim |
| 6,601,211 B1 | 7/2003 | Norman |
| 6,625,685 B1 | 9/2003 | Cho et al. |
| 6,671,757 B1 | 12/2003 | Cash et al. |
| 6,754,774 B2 | 6/2004 | Gruner et al. |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,850,443 B2 | 2/2005 | Lofgren et al. |
| 6,851,082 B1 | 2/2005 | Corbett |
| 6,871,295 B2 | 3/2005 | Ulrich et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,883,131 B2 | 4/2005 | Acton |
| 6,934,878 B2 | 8/2005 | Massa et al. |
| 6,938,133 B2 | 8/2005 | Johnson et al. |
| 6,944,791 B2 | 9/2005 | Humlicek |
| 6,959,413 B2 | 10/2005 | Humlicek et al. |
| 6,976,187 B2 | 12/2005 | Arnott et al. |
| 6,985,992 B1 | 1/2006 | Chang et al. |
| 7,010,652 B2 | 3/2006 | Piccirillo et al. |
| 7,024,586 B2 | 4/2006 | Kleiman et al. |
| 7,032,142 B2 | 4/2006 | Fujioka et al. |
| 7,043,599 B1 | 5/2006 | Ware et al. |
| 7,050,337 B2 | 5/2006 | Iwase et al. |
| 7,076,606 B2 | 7/2006 | Orsley |
| 7,089,391 B2 | 8/2006 | Geiger et al. |
| 7,100,004 B2 | 8/2006 | Chen et al. |
| 7,133,965 B2 | 11/2006 | Chien |
| 7,146,461 B1 | 12/2006 | Kiselev et al. |
| 7,181,572 B2 | 2/2007 | Walmsley |
| 7,191,379 B2 | 3/2007 | Adelmann et al. |
| 7,194,577 B2 | 3/2007 | Johnson et al. |
| 7,219,238 B2 | 5/2007 | Saito et al. |
| 7,222,257 B1 | 5/2007 | Dibb |
| 7,224,604 B2 | 5/2007 | Lasser |
| 7,227,797 B2 | 6/2007 | Thayer et al. |
| 7,243,203 B2 | 7/2007 | Scheuerlein |
| 7,243,293 B2 | 7/2007 | Chen |
| 7,308,532 B1 | 12/2007 | Wood et al. |
| 7,315,976 B2 | 1/2008 | Holt |
| 7,334,156 B2 | 2/2008 | Land et al. |
| 7,340,581 B2 | 3/2008 | Gorobets et al. |
| 7,350,101 B1 | 3/2008 | Nguyen et al. |
| 7,386,758 B2 | 6/2008 | Kitamura |
| 7,409,492 B2 | 8/2008 | Tanaka et al. |
| 7,426,655 B2 | 9/2008 | Shaik et al. |
| 7,451,266 B2 | 11/2008 | Shinagawa et al. |
| 7,526,686 B2 | 4/2009 | Kolvick et al. |
| 7,574,554 B2 * | 8/2009 | Tanaka et al. ............... 711/103 |
| 7,721,140 B2 | 5/2010 | Dell et al. |
| 7,721,182 B2 | 5/2010 | Joseph et al. |
| 7,856,528 B1 | 12/2010 | Frost et al. |
| 7,966,550 B2 * | 6/2011 | Mokhlesi et al. ............ 714/780 |
| 7,975,209 B2 * | 7/2011 | Chin et al. ................... 714/780 |
| 8,019,938 B2 * | 9/2011 | Flynn et al. ................. 711/113 |
| 8,019,940 B2 * | 9/2011 | Flynn et al. ................. 711/114 |
| 2002/0002690 A1 | 1/2002 | Lai et al. |
| 2002/0069317 A1 | 6/2002 | Chow et al. |
| 2002/0069318 A1 | 6/2002 | Chow et al. |
| 2002/0194530 A1 | 12/2002 | Santeler et al. |
| 2003/0023924 A1 | 1/2003 | Davis et al. |
| 2003/0120863 A1 | 6/2003 | Lee et al. |
| 2003/0135808 A1 | 7/2003 | Kakuta et al. |
| 2003/0145270 A1 | 7/2003 | Holt |
| 2003/0165076 A1 | 9/2003 | Gorobets et al. |
| 2003/0182592 A1 | 9/2003 | Massa et al. |
| 2003/0198084 A1 | 10/2003 | Fujisawa et al. |
| 2004/0015771 A1 | 1/2004 | Lasser et al. |
| 2004/0037120 A1 | 2/2004 | Uysal et al. |
| 2004/0163027 A1 | 8/2004 | MacLaren et al. |
| 2004/0163028 A1 | 8/2004 | Olarig |
| 2004/0168101 A1 | 8/2004 | Kubo |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0193166 A1 | 9/2005 | Johnson et al. |
| 2005/0246510 A1 | 11/2005 | Retnamma et al. |
| 2006/0004955 A1 | 1/2006 | Ware et al. |
| 2006/0041718 A1 | 2/2006 | Ulrich et al. |
| 2006/0129760 A1 | 6/2006 | Subbarao |
| 2006/0129899 A1 | 6/2006 | Cochran et al. |
| 2006/0143503 A1 | 6/2006 | Shaik et al. |
| 2006/0190683 A1 | 8/2006 | Takase |
| 2006/0265636 A1 | 11/2006 | Hummler |
| 2006/0282747 A1 | 12/2006 | Hummler |
| 2007/0016699 A1 | 1/2007 | Minami |
| 2007/0103992 A1 | 5/2007 | Sakui et al. |
| 2007/0180328 A1 | 8/2007 | Cornwell et al. |
| 2007/0198770 A1 | 8/2007 | Horii |
| 2007/0233949 A1 | 10/2007 | Hart |
| 2007/0255889 A1 | 11/2007 | Yogev et al. |
| 2007/0276988 A1 | 11/2007 | Luo et al. |
| 2007/0283079 A1 | 12/2007 | Iwamura et al. |
| 2007/0297252 A1 | 12/2007 | Singh |
| 2008/0016392 A1 | 1/2008 | Earl et al. |
| 2008/0022156 A1 | 1/2008 | Sutardja |
| 2008/0034253 A1 | 2/2008 | Hoya et al. |
| 2008/0034270 A1 | 2/2008 | Onishi et al. |
| 2008/0065827 A1 | 3/2008 | Byrne et al. |
| 2008/0091876 A1 | 4/2008 | Fujibayashi et al. |
| 2008/0168225 A1 | 7/2008 | O'Connor |
| 2008/0201616 A1 | 8/2008 | Ashmore |
| 2008/0250270 A1 | 10/2008 | Bennett |
| 2008/0256292 A1 | 10/2008 | Flynn et al. |
| 2008/0266962 A1 | 10/2008 | Jeon et al. |
| 2009/0037652 A1 | 2/2009 | Yu et al. |
| 2009/0125788 A1 | 5/2009 | Wheeler et al. |
| 2009/0164836 A1 | 6/2009 | Carmichael |
| 2009/0187785 A1 | 7/2009 | Gonzalez et al. |
| 2009/0282301 A1 | 11/2009 | Flynn et al. |

FOREIGN PATENT DOCUMENTS

| | | |
|---|---|---|
| JP | 2000259359 A | 9/2000 |
| WO | 2006029243 A1 | 3/2006 |
| WO | 2006050455 | 5/2006 |

OTHER PUBLICATIONS

PCT/US2010/035318 International Search Report and Written Opinion, Dec. 24, 2010.

PCT/US2010/035320 International Search Report and Written Opinion, Dec. 29, 2010.

ASPMC_660, Asine Group, http://www.asinegroup.com/products/aspm660.html, copyright 2002, downloaded on Nov. 18, 2009.

BiTMICRO Introduces E-Disk PMC Flash Disk Module at Military & Aerospace Electronics East, May 18, 2004, BiTMICRO, http://www.bitmicro.com/press_news_releases_20040518_prt.php.

NAND Flash 101: An Introduction to NAND Flash and How to Design it in to Your Next Product, Micron, pp. 1-28, Micron Technology Nov. 2006.

PCT/US2009/044414, International Search Report and Written Opinion, Jul. 21, 2009.

Bad Block Management in NAND Flash Memories, AN1819 Application Note, May 19, 2004, downloaded from www.datasheetarchive.com on Jul. 2, 2009.

Error Correction Code in Single Level Cell NAND Flash Memories, AN1823 Application Note, Nov. 17, 2004, downloaded from www.datasheetarchive.com on Jul. 2, 2007.

Chen, What Types of ECC Should Be Used on Flash Memory, Spansion Application Note, Nov. 27, 2007, downloaded from www.spansion.com/application_notes/Types_of_ECC_Used_on_Flash_AN_01_e.pdf on Jul. 2, 2009.

IBM Chipkill Memory, Enhancing IBM Netfinity Server Reliability, Feb. 1999, pp. 1-6.

Alvarez, Tolerating Multiple Failures in RAID Architectures with Optimal Storage and Uniform Declustering, Department of Computer Science and Engineering, University of California, San Diego, 1997, pp. 62-72.

Bhargava, A Model for Adaptable Systems for Transaction Processing, IEEE Transactions on Knowledge and Data Engineering, Dec. 1989, pp. 433-449, vol. 1, No. 4, Downloaded on Mar. 16, 2009.

Method for Preventing Catastrophic Failures in RAID Volumes Using Dynamic Reconfiguration, IP.com Prior Art Database Technical Disclosure, Jun. 15, 2005, IPCOM000125746D.

PCT/US2010/035318, IPRP, Dec. 1, 2011.

PCT/US2010/035320, IPRP, Dec. 1, 2011.

Examination Report from EP Office, Application No. 09747781.4, May 7, 2012.

Wacha, Brandt, Bent, Grider, Nunez, Improving RAID-Based Storage Systems with Flash Memory, First annual ISSDM/SRL Research symposium, Oct. 2009.

Office Action; U.S. Appl. No. 12/467,914; mailed Apr. 22, 2011.

Office Action; U.S. Appl. No. 12/467,914; mailed Oct. 14, 2011.

Office Action; U.S. Appl. No. 12/468,041; mailed Mar. 15, 2012.

* cited by examiner

APPARATUS, SYSTEM, AND METHOD FOR RECONFIGURING AN ARRAY TO OPERATE WITH LESS STORAGE ELEMENTS

BACKGROUND

1. Field of the Invention

This invention relates to data storage and more particularly relates to reconfiguring an array to operate with less storage elements.

2. Description of the Related Art

Solid-state storage, as well as other forms of data storage media, is subject to failure or data error on specific regions within the solid-state storage. In other instances, an entire device or chip is defective and nonfunctional. Often, a plurality of memory devices or storage elements are used, such as in a distributed redundant array of independent drives ("RAID") or other redundant data system. An array of memory devices such as a RAID system provides a level of protection against data errors and device failures, as parity data stored in the array can be used to replace failed data.

In a typical RAID system, if a data device fails, the parity devices(s) are used to rebuild the data within the failed device onto a replacement data device. If a parity device fails, the data in the data devices is used to rebuild the parity data in a replacement parity device.

Typically, a RAID system provides data protection in the event that a certain number of data or parity devices fail. If these devices are not replaced, and the number of defective devices falls below the certain number of failed devices that the RAID system accommodates, data will be lost.

SUMMARY

From the foregoing discussion, it should be apparent that a need exists for an apparatus, system, and method for reconfiguring an array to operate with less storage elements. Beneficially, such an apparatus, system, and method would reconfigure an array of solid-state storage elements protected using parity data.

The present invention has been developed in response to the present state of the art, and in particular, in response to the problems and needs in the art that have not yet been fully solved by currently available storage arrays. Accordingly, the present invention has been developed to provide an apparatus, system, and method for reconfiguring an array to operate with less storage elements that overcome many or all of the above-discussed shortcomings in the art.

The apparatus to reconfigure an array of solid-state storage elements protected using parity data is provided with a plurality of modules configured to functionally execute the necessary steps of determining that one or more storage elements are unavailable to store data, reading data from storage elements other than the unavailable storage elements, using the first parity data to regenerate missing data from the first ECC chunk, and generating second ECC. These modules in the described embodiments include a storage element error module, a reconfigure data read module, a data regeneration module, a data reconfiguration module, and a new configuration storage module.

The storage element error module determines that one or more storage elements are unavailable to store data ("unavailable storage elements"). The storage element resides in an array of three or more storage elements. Each storage element in the array includes non-volatile solid-state storage. Data is written to a logical page of the array. A logical page of the array includes a page on each of the storage elements in the array. The array includes N number of storage elements storing a first ECC chunk and P number of storage elements storing first parity data generated from the first ECC chunk. The ECC chunk includes data ("stored data") and a first error correcting code ("ECC") generated from the stored data. A portion of the first ECC chunk is stored on each of N number of storage elements.

In one embodiment, the storage element error module determines that a storage element is in error by determining that errors in the first ECC chunk are uncorrectable using the ECC stored with the first ECC chunk. In a further embodiment, the storage element error module includes a storage element error location module that uses data stored in one or more of the storage elements storing one or more ECC chunks and storing associated parity data to identify the storage element that is unavailable for storing data. In yet a further embodiment, the storage element error location module uses hardware gates and logic to substitute the data stored in one or more of the storage elements storing one or more ECC chunks.

In another embodiment, the storage element error module determines that a storage element is in error by determining that a storage element that is functioning has reached a replacement threshold ("failing storage element"). In a further embodiment, the replacement threshold includes one or more of a rate of errors in data stored on the failing storage element, a number of errors in data stored on the failing storage element, a number of read and/or write operations on the failing storage element, and an environmental condition in the failing storage element.

The reconfigure data read module reads data from storage elements other than the unavailable storage elements ("available data"). The available data includes data from a logical page.

The data regeneration module, in response to the available data including first parity data, uses the first parity data to regenerate missing data from the first ECC chunk ("missing data").

The data reconfiguration module generates second ECC from one or more of the available data, the missing data, and data received by a storage controller ("new data"). The second ECC together with data used to create the second ECC include a second ECC chunk. The data reconfiguration module also generates second parity data from the second ECC chunk. The storage controller controls data storage on the array storage elements.

The new configuration storage module stores a portion of the second ECC chunk and associated second parity data on (N+P)−Z number of storage elements, wherein $1 \leq Z \leq P$. In one embodiment, each of the storage elements of the array includes one or more append points and data is stored on the array of storage elements sequentially. The new configuration storage module stores the second ECC chunk and associated parity data at an append point on each of the (N+P)−Z storage elements. Each append point is moved to the end of data stored just prior to movement of the append point.

In one embodiment, the new configuration storage module stores the second ECC chunk on (N−Z) storage elements and the associated second parity data on P storage elements. In another embodiment, the new configuration storage module stores the second ECC chunk on N storage elements and the associated second parity data on P−Z storage elements where P>1.

In one embodiment, the apparatus includes a reconfiguration log module that identifies one or more regions in the array of storage elements where data is stored in (N+P)−Z storage elements. A region includes a portion of each of the N+P storage elements. In a further embodiment, a region includes one of a portion of a logical page, a logical page, a group of logical pages, a portion of an erase block, an erase block, a group of erase blocks, one or more dies, and one or more chips.

In a further embodiment, the reconfiguration log module tracks a storage region that is unavailable for data storage on the unavailable storage device such that data is stored on (N+P)−Z storage elements for the unavailable region and on N+P storage elements for locations outside the unavailable storage region. A storage region includes a portion of each of the N+P storage elements.

In a further embodiment, the reconfiguration log module further tracks one or more unavailable storage regions where data is stored in (N+P)−Z storage elements and one or more additional unavailable storage regions where data is stored in ((N+P)−Z)−X storage elements. In storage regions other than the unavailable storage regions data is stored in N+P storage elements. In another embodiment, a storage region includes one or more of a portion of a logical page, a logical page, a plurality of logical pages, a portion of a logical erase block, a logical erase block, a plurality of logical erase blocks, a die, a plurality of dies, a chip, and a plurality of chips. In another embodiment, storage regions with more available storage elements have a higher performance than storage regions with less available storage elements. Data is stored and segregated in the array of storage elements by performance requirements of the data such that data with a higher performance requirement is given a higher priority to be stored in storage regions with a higher performance.

In one embodiment, at least the reconfigure data read module, the data regeneration module, and the data reconfiguration module operate in a background process. In a further embodiment, the background process includes a storage space recovery operation.

In one embodiment, in response to the storage element error module determining one or more unavailable storage elements and the reconfigure data module, the data regeneration module, the data reconfiguration module, and the new configuration storage module acting to store one or more ECC chunks on (N+P)−Z storage elements, the storage element error module determines one or more additional unavailable storage elements and the reconfigure data module, the data regeneration module, the data reconfiguration module, and the new configuration storage module act to store one or more additional ECC chunks on ((N+P)−Z)−Y storage elements.

A system of the present invention is also presented to reconfigure an array of solid-state storage elements protected using parity data. The system may be embodied as a storage device comprising a storage controller and an array of storage elements controlled by the storage controller. The storage element is in an array of three or more storage elements. Each storage element in the array includes non-volatile solid-state storage. Data is written to a logical page of the array. A logical page of the array includes a page on each of the storage elements in the array. The array includes N number of storage elements storing a first ECC chunk and P number of storage elements storing first parity data generated from the first ECC chunk. The ECC chunk includes data ("stored data") and a first error correcting code ("ECC") generated from the stored data. A portion of the first ECC chunk is stored on each of N number of storage elements.

The system may also include similar modules to those described above in relation to the apparatus. In particular, the system, in one embodiment, includes a storage element error module, a reconfigure data read module, a data regeneration module, a data reconfiguration module, and a new configuration storage module.

The storage element error module determines that one or more storage elements are unavailable to store data ("unavailable storage elements"). The reconfigure data read module reads data from storage elements other than the unavailable storage elements ("available data"). The available data includes data from a logical page.

The data regeneration module, in response to the available data comprising first parity data, uses the first parity data to regenerate missing data from the first ECC chunk ("missing data").

The data reconfiguration module generates second ECC from one or more of the available data, the missing data, and data received by a storage controller ("new data"). The second ECC together with data used to create the second ECC include a second ECC chunk. The data reconfiguration module also generates second parity data from the second ECC chunk. The storage controller controls data storage on the array storage elements.

The new configuration storage module stores a portion of the second ECC chunk and associated second parity data on (N+P)−Z number of storage elements, wherein $1 \leq Z \leq P$.

In one embodiment, the system includes a driver on a server. The server is in communication with the storage device over a computer network. The driver interacts with the storage controller to store data on the array of storage elements.

A computer program product comprising a computer readable medium having computer usable program code executable to perform operations is also presented for reconfiguring an array of solid-state storage elements protected using parity data.

The computer program product includes determining that one or more storage elements are unavailable to store data ("unavailable storage elements"). The storage element is in an array of three or more storage elements. Each storage element in the array includes non-volatile solid-state storage. Data is written to a logical page of the array. The logical page of the array includes a page on each of the storage elements in the array. The array includes N number of storage elements storing a first ECC chunk and P number of storage elements storing first parity data generated from the first ECC chunk. The ECC chunk includes data ("stored data") and a first error correcting code ("ECC") generated from the stored data. A portion of the first ECC chunk is stored on each of N number of storage elements.

The computer program product includes reading data from storage elements other than the unavailable storage elements ("available data"). The available data includes data from a logical page. The computer program product includes, in response to the available data comprising first parity data, using the first parity data to regenerate missing data from the first ECC chunk ("missing data").

The computer program product includes generating second ECC from one or more of the available data, the missing data, and data received by a storage controller ("new data"). The second ECC together with data used to create the second ECC include a second ECC chunk. The computer program product generates second parity data from the second ECC chunk. The storage controller controls data storage on the array storage elements.

The computer program product includes storing a portion of the second ECC chunk and associated second parity data on (N+P)−Z number of storage elements, wherein $1 \leq Z \leq P$.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
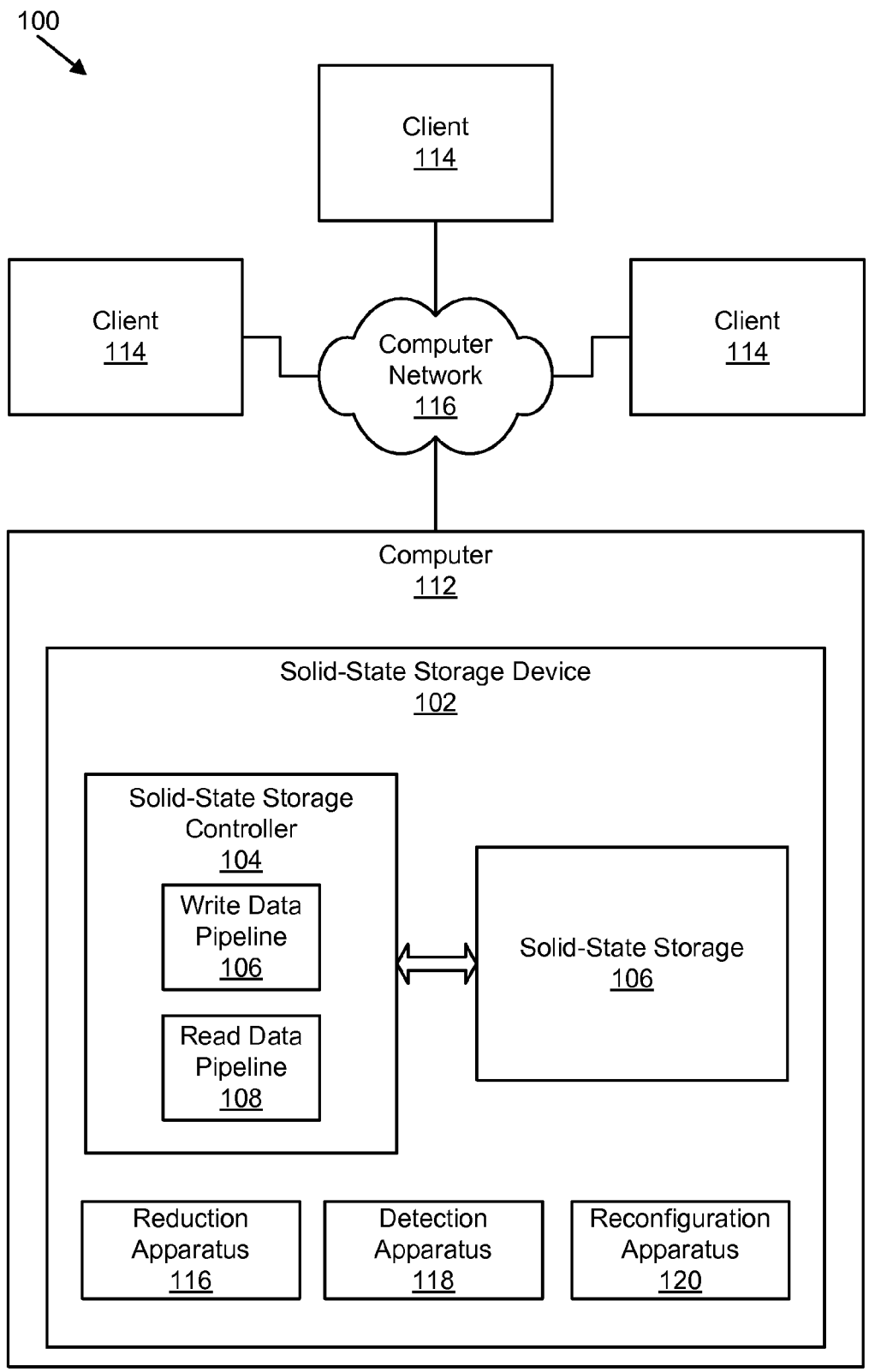
FIG. 1 is a schematic block diagram illustrating one embodiment of a system for data management in a solid-state storage device in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1 is a schematic block diagram illustrating one embodiment of a system 100 for data management in a solid-state storage device in accordance with the present invention. The system 100 includes a solid-state storage device 102, a solid-state storage controller 104, a write data pipeline 106, a read data pipeline 108, a solid-state storage 110, a computer 112, a client 114, and a computer network 116, which are described below. Furthermore, in various embodiments the system 100 also includes a reduction apparatus 116, a detection apparatus 118, and a reconfiguration apparatus 120.

The system 100 includes at least one solid-state storage device 102. In another embodiment, the system 100 includes two or more solid-state storage devices 102. Each solid-state storage device 102 may include non-volatile, solid-state storage 110, such as flash memory, nano random access memory ("nano RAM or NRAM"), magneto-resistive RAM ("MRAM"), dynamic RAM ("DRAM"), phase change RAM ("PRAM"), Racetrack memory, Memristor memory, etc. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

The system 100 includes a reduction apparatus 116. The reduction apparatus 116 is depicted in FIG. 1 in the solid-state storage device 102, but may be in the solid-state storage controller 104, solid-state storage 110, computer 112, etc. The reduction apparatus 116 may be located together or distributed. One of skill in the art will recognize other forms of a reduction apparatus 116. The reduction apparatus 116 is described in more detail below.

The system 100 also includes a detection apparatus 118. The detection apparatus 118 is depicted in FIG. 1 in the solid-state storage device 102, but may be in the solid-state storage controller 104, solid-state storage 106, computer 112, etc. The detection apparatus 118 may be located together or distributed. One of skill in the art will recognize other forms of a detection apparatus 118. The detection apparatus 118 is described in more detail below.

The system 100 includes a reconfiguration apparatus 120. The reconfiguration apparatus 120 is depicted in FIG. 1 in the solid-state storage device 102, but may be in the solid-state storage controller 104, solid-state storage 106, computer 112, etc. The reconfiguration apparatus 120 may be located together or distributed. One of skill in the art will recognize other forms of a reconfiguration apparatus 120. The reconfiguration apparatus 120 is described in more detail below.

Solid-State Storage Device

Figure 2:
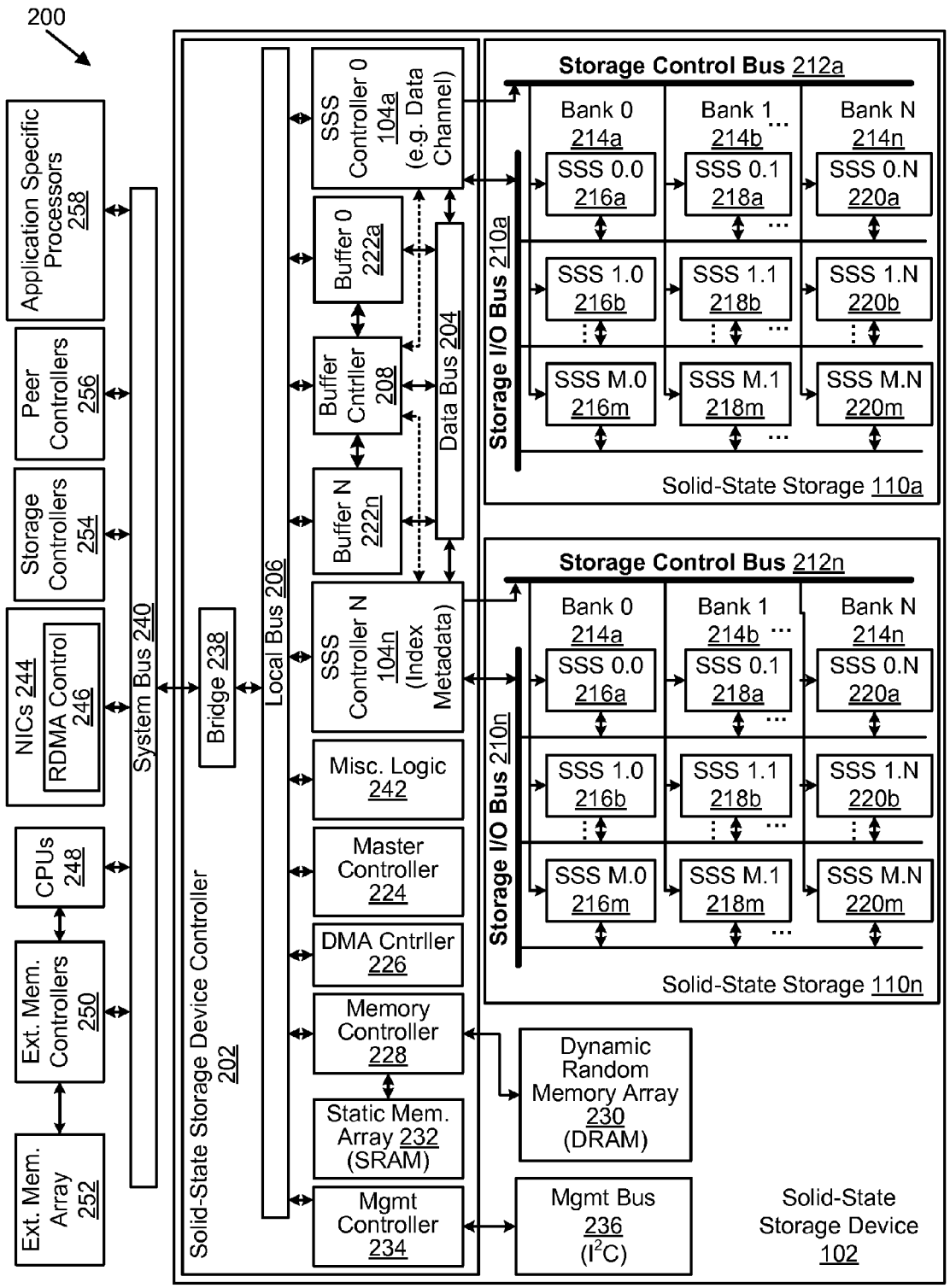
FIG. 2 is a schematic block diagram illustrating one embodiment of a solid-state storage device controller in a solid-state storage device in accordance with the present invention.

FIG. 2 is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage 110. In the depicted embodiment, two solid-state controllers are shown: solid-state controller 0 104a and solid-state storage controller N 104n, and each controls solid-state storage 110a-n. In the depicted embodiment, solid-state storage controller 0 104a controls a data channel so that the attached solid-state storage 110a stores data. Solid-state storage controller N 104n controls an index metadata channel associated with the stored data and the associated solid-state storage 110n stores index metadata. In an alternate embodiment, the solid-state storage device controller 202 includes a single solid-state controller 104a with a single solid-state storage 110a. In another embodiment, there are a plurality of solid-state storage controllers 104a-n and associated solid-state storage 110a-n. In one embodiment, one or more solid state controllers 104a-104n-1, coupled to their associated solid-state storage 110a-110n-1, control data while at least one solid-state storage controller 104n, coupled to its associated solid-state storage 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage 110, data cannot be read from the solid-state storage 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage 110. In one embodiment, a solid-state storage 110a includes twenty solid-state storage elements 216, 218, 220 per bank 214 with eight banks 214 and a solid-state storage 110n includes 2 solid-state storage elements 216, 218 per bank 214 with one bank 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210*a* row (e.g. 216*b*, 218*b*, 220*b*) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216*a*) may have one or more virtual dies per die and one or more dies per chip and one or more chips stacked vertically and each virtual die may be accessed independently. In another embodiment, a solid-state storage element SSS 0.0 216*a* may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216*a*-220*a*, each in a separate bank 214*a*-*n*. In another embodiment, 20 storage elements (e.g. SSS 0.0-SSS 20.0) 216 form a g ha logical bank 214*a* so that each of the eight logical banks has 20 storage elements (e.g. SSS 0.0-SSS 20.8) 216, 218, 220. Data is sent to the solid-state storage 110 over the storage I/O bus 210 to all storage elements of a particular group of storage elements (SSS 0.0-SSS 0.8) 216*a*, 218*a*, 220*a*. The storage control bus 212*a* is used to select a particular bank (e.g. Bank-0 214*a*) so that the data received over the storage I/O bus 210 connected to all banks 214 is written just to the selected bank 214*a*.

In a preferred embodiment, the storage I/O bus 210 is comprised of one or more independent I/O buses ("IIOBa-m" comprising 210*a.a-m*, 210*n.a-m*) wherein the solid-state storage elements within each row share one of the independent I/O buses accesses each solid-state storage element 216, 218, 220 in parallel so that all banks 214 are accessed simultaneously. For example, one channel of the storage I/O bus 210 may access a first solid-state storage element 216*a*, 218*a*, 220*a* of each bank 214*a*-*n* simultaneously. A second channel of the storage I/O bus 210 may access a second solid-state storage element 216*b*, 218*b*, 220*b* of each bank 214*a*-*n* simultaneously. Each row of solid-state storage element 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214*a-n* are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS0.0) includes two registers and can program two pages so that a two-register solid-state storage element 216, 218, 220 has a capacity of 4 kB. A bank 214 of 20 solid-state storage elements 216, 218, 220 would then have an 80 kB capacity of pages accessed with the same address going out the channels of the storage I/O bus 210.

This group of pages in a bank 214 of solid-state storage elements 216, 218, 220 of 80 kB may be called a logical page or virtual page. Similarly, an erase block of each storage element 216*a-m* of a bank 214*a* may be grouped to form a logical erase block or a virtual erase block. In a preferred embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a of a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a row of storage elements (e.g. SSS 0.0-SSS 0.N 216*a*, 218*a*, 220*a*) are accessed simultaneously by the appropriate bus within the storage I/O bus 210*a.a*, to reach the proper page and to avoid writing the data packet to similarly addressed pages in the row of storage elements (SSS 0.0-SSS 0.N 216*a*, 218*a*, 220*a*), the bank 214*a* that includes the solid-state storage element SSS 0.0 216*a* with the correct page where the data packet is to be written is simultaneously selected by the storage control bus 212.

Similarly, a read command traveling on the storage I/O bus 210 requires a simultaneous command on the storage control bus 212 to select a single bank 214*a* and the appropriate page within that bank 214*a*. In a preferred embodiment, a read command reads an entire page, and because there are multiple solid-state storage elements 216, 218, 220 in parallel in a bank 214, an entire virtual page is read with a read command. However, the read command may be broken into subcommands, as will be explained below with respect to bank interleave. A virtual page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. bank-0 214*a*) is selected over the storage control bus 212 to prevent erasure of similarly addressed erase blocks in all of the banks (banks 1-N 214*b-n*). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with the object are located and read in a read operation. Data segments of the modified object that have been modified are not written to the location from which they are read. Instead, the modified data segments are again converted to data packets and then written sequentially to the next available location in the logical page currently being written. The object index entries for the respective data packets are modified to point to the packets that contain the modified data segments. The entry or entries in the object index for data packets associated with the same object that have not been modified will include pointers to original location of the unmodified data packets. Thus, if the original object is maintained, for example to maintain a previous version of the object, the original object will have pointers in the object index to all data packets as originally written. The new object will have pointers in the object index to some of the original data packets and pointers to the modified data packets in the logical page that is currently being written.

In a copy operation, the object index includes an entry for the original object mapped to a number of packets stored in the solid-state storage 110. When a copy is made, a new object is created and a new entry is created in the object index mapping the new object to the original packets. The new object is also written to the solid-state storage 110 with its location mapped to the new entry in the object index. The new object packets may be used to identify the packets within the original object that are referenced in case changes have been made in the original object that have not been propagated to the copy and the object index is lost or corrupted.

Beneficially, sequentially writing packets facilitates a more even use of the solid-state storage 110 and allows the solid-storage device controller 202 to monitor storage hot spots and level usage of the various logical pages in the solid-state storage 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage 110 over a storage I/O bus 210. In a typical embodiment where the solid-state storage is arranged in banks 214 and each bank 214 includes multiple storage elements 216, 218, 220 accessed in parallel, the storage I/O bus 210 is an array of busses, one for each row of storage elements 216, 218, 220 spanning the banks 214. As used herein, the term "storage I/O bus" may refer to one storage I/O bus 210 or an array of data independent busses 204. In a preferred embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage 110 such as NAND flash or other storage media. In a preferred embodiment, data and associated out-of-band metadata ("object metadata") arriving with the data is communicated using one or more data channels comprising one or more solid-state storage controllers 104a-104n-1 and associated solid-state storage 110a-110n-1 while at least one channel (solid-state storage controller 104n, solid-state storage 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device 152/solid-state storage device controller 202 manages multiple data storage devices/solid-state storage 110a-n, the master controller 224 divides the work load among internal controllers, such as the solid-state storage controllers 104a-n. For example, the master controller 224 may divide an object to be written to the data storage devices (e.g. solid-state storage 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device 152/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116 and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple logical devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
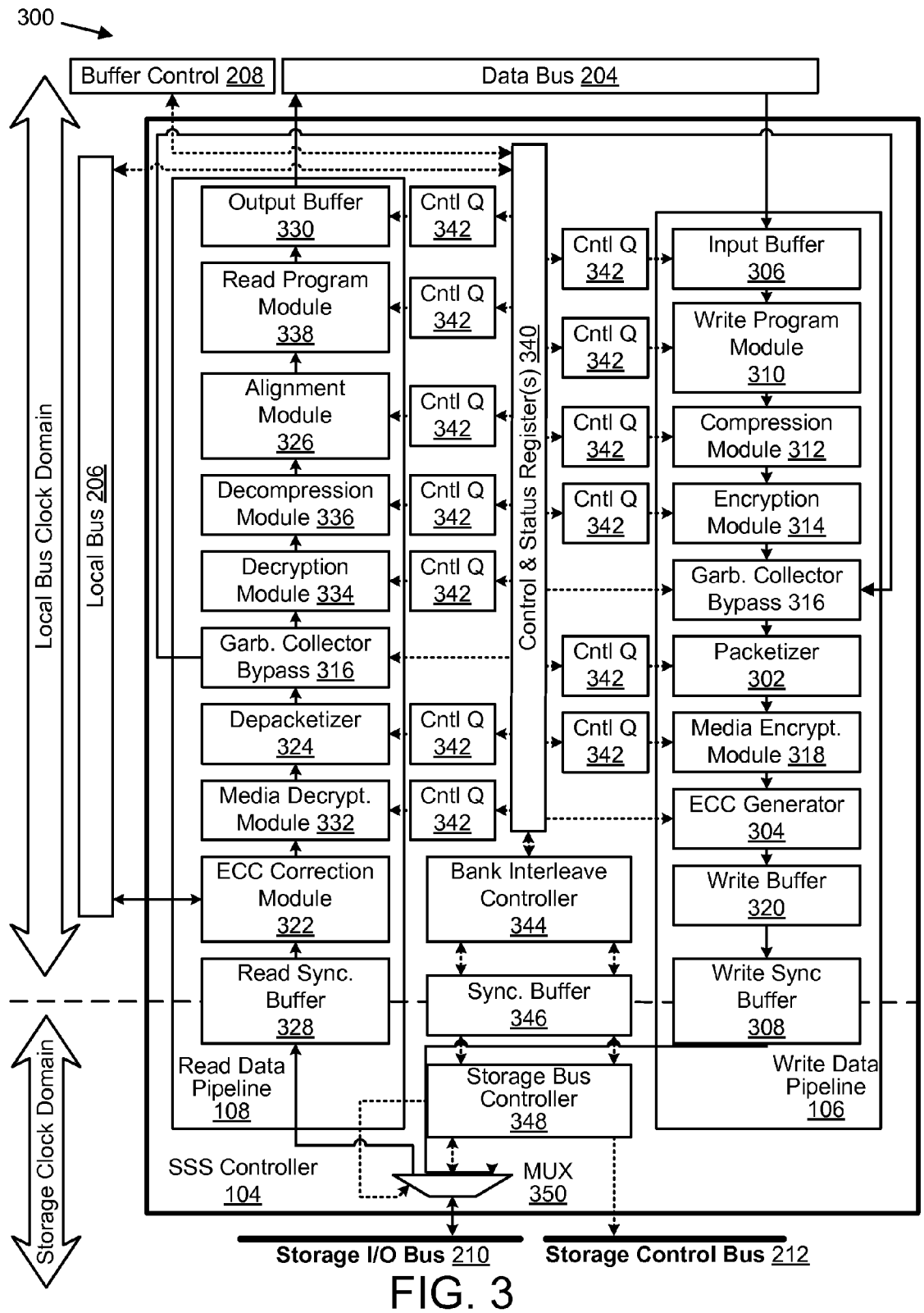
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state storage controller 104 and associated write data pipeline 106 and read data pipeline 108 are described below. In other embodiments, synchronous solid-state storage 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage 110. The data or metadata segment is typically part of an object, but may also include an entire object. In another embodiment, the data segment is part of a block of data, but may also include an entire block of data. Typically, an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that generates one or more error-correcting codes ("ECC") for the one or more packets received from the packetizer 302. The ECC generator 304 typically uses an error correcting algorithm to generate ECC which is stored with the packet. The ECC stored with the packet is typically used to detect and correct errors introduced into the data through transmission and storage. In one embodiment, packets are streamed into the ECC generator 304 as un-encoded blocks of length N. A syndrome of length S is calculated, appended and output as an encoded block of length N+S. The data packets of length N combined with a syndrome S form an ECC chunk or ECC block. The value of N and S are dependent upon the characteristics of the algorithm which is selected to achieve specific performance, efficiency, and robustness metrics. In the preferred embodiment, there is no fixed relationship between the ECC chunks and the packets; the packet may comprise more than one ECC chunk; the ECC chunk may comprise more than one packet; and a first packet may end anywhere within the ECC chunk and a second packet may begin after the end of the first packet within the same ECC chunk. In the preferred embodiment, ECC algorithms are not dynamically modified. In a preferred embodiment, the ECC stored with the data packets is robust enough to correct errors in more than two bits.

Beneficially, using a robust ECC algorithm allowing more than single bit correction or even double bit correction allows the life of the solid-state storage 110 to be extended. For example, if flash memory is used as the storage medium in the solid-state storage 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 102 may comprise less reliable storage such as multi-level cell ("MLC") flash in order to increase capacity, which storage may not be sufficiently reliable without more robust ECC algorithms.

In one embodiment, the write data pipeline 106 includes an input buffer 306 that receives a data segment to be written to the solid-state storage 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage 110. The write synch buffer 308 is located at a boundary between a local clock domain and a solid-state storage clock domain and provides buffering to account for the clock domain differences. In other embodiments, synchronous solid-state storage 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from an embodiment that integrates the solid-state storage 110 and where the embodiment requires encryption protection. The media encryption module 318 and corresponding media decryption module 332 provide a level of security for data stored in the solid-state storage 110. For example, where data is encrypted with the media encryption module 318, if the solid-state storage 110 is connected to a different solid-state storage controller 104, solid-state storage device 102, or computer 112, the contents of the solid-state storage 110 typically could not be read without use of the same encryption key used during the write of the data to the solid-state storage 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be used to store every packet. Data segments may be split between multiple packets with unique nonces for the purpose of improving protection by the encryption algorithm. The encryption key may be received from a client 114, a computer 112, key manager, or other device that manages the encryption key to be used by the solid-state storage controller 104. In another embodiment, the solid-state storage 110 may have two or more partitions and the solid-state storage controller 104 behaves as though it were two or more solid-state storage controllers 104, each operating on a single partition within the solid-state storage 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption module 314 differs from the media encryption module 318 in that the encryption keys used by the encryption module 314 to encrypt data may not be common to all data stored within the solid-state storage device 102 but may vary on an object basis and received in conjunction with receiving data segments as described below. For example, an encryption key for a data segment to be encrypted by the encryption module 314 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm. In one embodiment, the nonce used by the media encryption module 318 is the same as that used by the encryption module 314.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage, such as a logical erase block, may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, valid packets recovered from a logical erase block being recovered are mixed with incoming packets from a client 114. In another embodiment, valid packets recovered from a logical erase block being recovered are stored together without incoming data packets interspersed. In a preferred embodiment, the garbage collector bypass 316 is part of an autonomous garbage collector system that operates within the solid-state storage device 102. This allows the solid-state storage device 102 to manage data so that data is systematically spread throughout the solid-state storage 110 to improve performance, data reliability and to avoid overuse and underuse of any one location or area of the solid-state storage 110 and to lengthen the useful life of the solid-state storage 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write data pipeline 106 to fill the remainder of the virtual page in order to improve the efficiency of storage within the Solid-State Storage 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one logical page in the solid-state storage 110. This allows a write operation to send an entire page of data to the solid-state storage 110 without interruption. By sizing the write buffer 320 of the write data pipeline 106 and buffers within the read data pipeline 108 to be the same capacity or larger than a storage write buffer within the solid-state storage 110, writing and reading data is more efficient since a single write command may be crafted to send a full logical page of data to the solid-state storage 110 instead of multiple commands.

While the write buffer 320 is being filled, the solid-state storage 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a logical page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a logical page of data segments. One of skill in the art will recognize other write buffer 320 configurations that allow a logical page of data to be stored prior to writing the data to the solid-state storage 110.

In another embodiment, the write buffer 320 is sized smaller than a logical page so that less than a page of information could be written to a storage write buffer in the solid-state storage 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage 110 to fill the pages of a logical page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC chunks for a requested packet received from the solid-state storage 110 by using ECC stored with each ECC chunk of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC chunks of the requested packet with up to three bits in error. The ECC correction module 322 corrects the bits in error by changing the bits in error to the correct one or zero state so that the requested data packet is identical to when it was written to the solid-state storage 110 and the ECC was generated for the packet.

If the ECC correction module 322 determines that the requested packets contains more bits in error than the ECC can correct, the ECC correction module 322 cannot correct the errors in the corrupted ECC chunks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC chunks of the requested packet with the interrupt and/or the message.

In the preferred embodiment, a corrupted ECC chunk or portion of a corrupted ECC chunk of the requested packet that cannot be corrected by the ECC correction module 322 is read by the master controller 224, corrected, and returned to the ECC correction module 322 for further processing by the read data pipeline 108. In one embodiment, a corrupted ECC chunk or portion of a corrupted ECC chunk of the requested packet is sent to the device requesting the data. The requesting device 155 may correct the ECC chunk or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another preferred embodiment, the solid-state storage controller 104 stores data using some type of RAID and is able to recover the corrupted data. In another embodiment, the ECC correction module 322 sends and interrupt and/or message and the receiving device fails the read operation associated with the requested data packet. One of skill in the art will recognize other options and actions to be taken as a result of the ECC correction module 322 determining that one or more ECC chunks of the requested packet are corrupted and that the ECC correction module 322 cannot correct the errors.

The read data pipeline 108 includes a depacketizer 324 that receives ECC chunks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device, the alignment module 326 may discard the unwanted data.

In one embodiment, the read data pipeline 108 includes a read synchronization buffer 328 that buffers one or more requested packets read from the solid-state storage 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device. The output buffer 330 accounts for differences between when data segments are received from stages of the read data pipeline 108 and when the data segments are transmitted to other parts of the solid-state storage controller 104 or to the requesting device. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically, the encryption key used to decrypt data by the media decryption module 332 is identical to the encryption key used by the media encryption module 318. In another embodiment, the solid-state storage 110 may have two or more partitions and the solid-state storage controller 104 behaves as though it were two or more solid-state storage controllers 104 each operating on a single partition within the solid-state storage 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. Typically, the decryption module 334 uses a different encryption key to decrypt a data segment than the media decryption module 332 uses to decrypt requested packets. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In the preferred embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

The solid-state storage controller 104 and or solid-state storage device 102 may also include a bank interleave controller 344, a synchronization buffer 346, a storage bus controller 348, and a multiplexer ("MUX") 350.

Storage Element Configuration

Figure 4A:
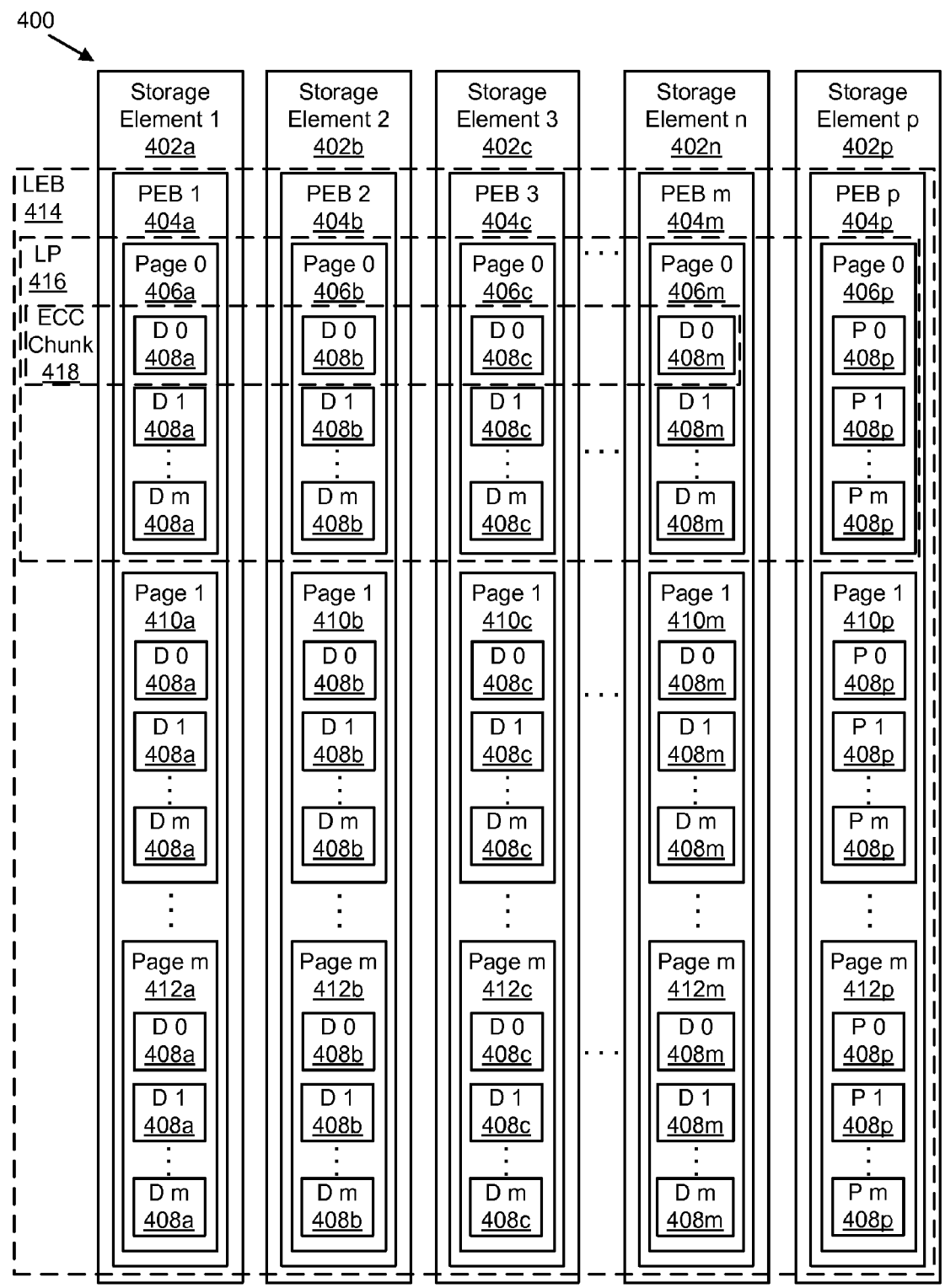
FIG. 4A is a schematic block diagram illustrating one embodiment of an array of storage elements in accordance with the present invention.

FIG. 4A is a schematic block diagram illustrating one embodiment of an array 400 of N+P number of storage elements 402 in accordance with the present invention. The array 400 of storage elements 402 includes N number of storage elements 402a, 402b, . . . 402n and P number of storage elements 402p storing parity data generated from the data stored on the N number of storage elements 402a . . . 402n. The storage element 402 storing parity data 402p may be a dedicated parity storage element 402 that may only store parity data. In addition, the parity data may be rotated among the storage elements 402 as described below. While a single parity storage element 402p is depicted, one of ordinary skill in the art realizes that a plurality of parity storage elements 402p may be used. Additional parity data may be stored on additional storage elements 402 (not shown) in various forms, such as using complex parity schemes designed to allow data recovery after multiple failures, using simple parity where two or more storage elements 402 have copies of the same parity data, etc. Each storage element 402 may comprise a device, a chip, a portion of a chip, a die, and the like.

Furthermore, in one embodiment each storage element 402 includes a physical erase block ("PEB") 404. For example, storage element 1 402a includes PEB 1 404a. A physical erase block is typically an erase block located on one die, chip, or other storage element 402. Each PEB 404 includes m physical pages 406. For example, PEB 1 404a includes page 0 406a, page 1 410a, . . . page m 412a. Each physical page 406a stores a portion of data and Error Correcting Code ("ECC") distributed with the data ("D") 408. Moreover, the physical pages 406p, 410p, . . . 412p on the parity storage element 402p store parity data 408p.

In one embodiment, a group of PEBs 404 forms a logical erase block ("LEB"). An LEB 414 spans the array of N+P storage elements 402 including the parity storage element 402p. Furthermore, in an embodiment, a logical page ("LP") 416 spans a plurality of physical pages 406 in a row, including the physical pages 406p on the parity storage element 402p. In another embodiment a logical page 416 spans N storage elements 402a-n without the parity storage element 402p such that parity data is stored on the storage element 402p with parity data in a separate step than data is stored in the N storage elements 402a-n.

In one embodiment, the ECC is a block code that is distributed with the data. Furthermore, the data and the ECC may not be aligned to any particular physical hardware boundary. As a result, error correction with the ECC is not dependent on a particular hardware configuration. Therefore, the ECC and corresponding data may form an ECC chunk and the ECC chunk may be divided and stored on one or more of the N storage elements 402a-n. An ECC chunk 418 typically spans at least a portion of a plurality of physical pages 406 of a logical page 416 where the data and ECC generated from the data 408a, 408b, . . . 408m are spread across the N storage elements 402a-n not including the parity data 408p on the parity storage element 402p. The storage element containing parity data 402p may be dynamically rotated among the storage elements 402 comprising the array 400 of storage elements 402. In a preferred embodiment, a LP 416 includes a plurality of ECC chunks 418. A physical page 406 may contain one or more data bytes of the ECC chunk 418. An ECC chunk 418 may span multiple rows within a physical page 406 and a physical page 406 may include a plurality of ECC chunks 418.

Figure 4B:
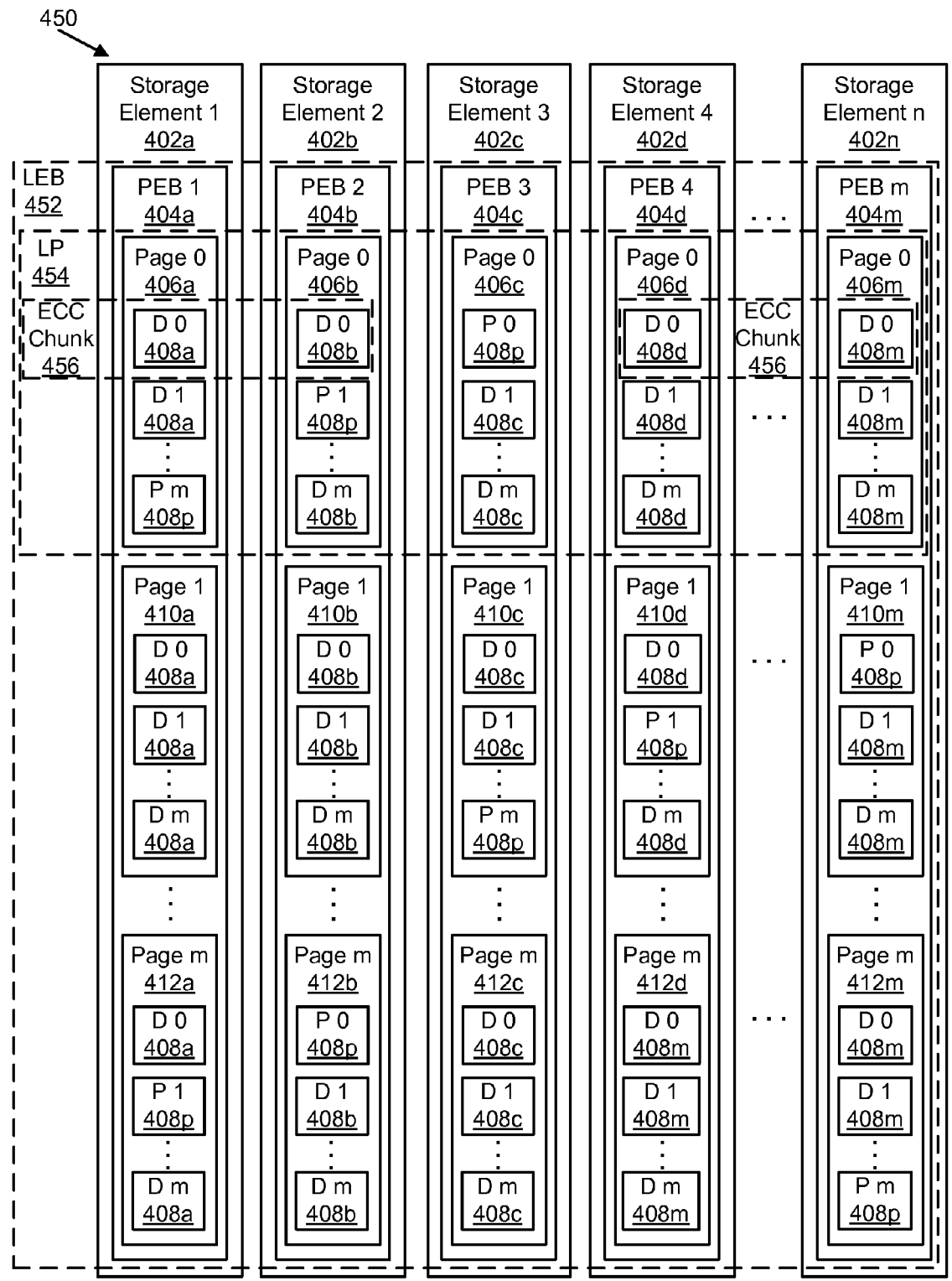
FIG. 4B is a schematic block diagram illustrating another embodiment of an array of storage elements in accordance with the present invention.

FIG. 4B is a schematic block diagram illustrating another embodiment of an array of N+P storage elements 450 with distributed parity in accordance with the present invention. In the depicted embodiment, the parity data 408p is distributed. Therefore, the storage elements 402 of the logical page 454 that store parity data 408p alternate. For example, LP 454 includes parity data 408p on storage element 3 402c for a particular row of data parity data 408p on storage element 2 402b for another row of data. In this embodiment, the ECC chunk 456 is still independent of parity data. In another embodiment, the parity information is stored within the same storage element 402 for all ECC chunks 456 within a LP 454 and changes only on LP 454 boundaries. In another embodiment, the location of the parity is stored within the same storage element 402 within an LEB 452 and changes only on LEB 452 boundaries.

Increased Data Integrity

Figure 5:
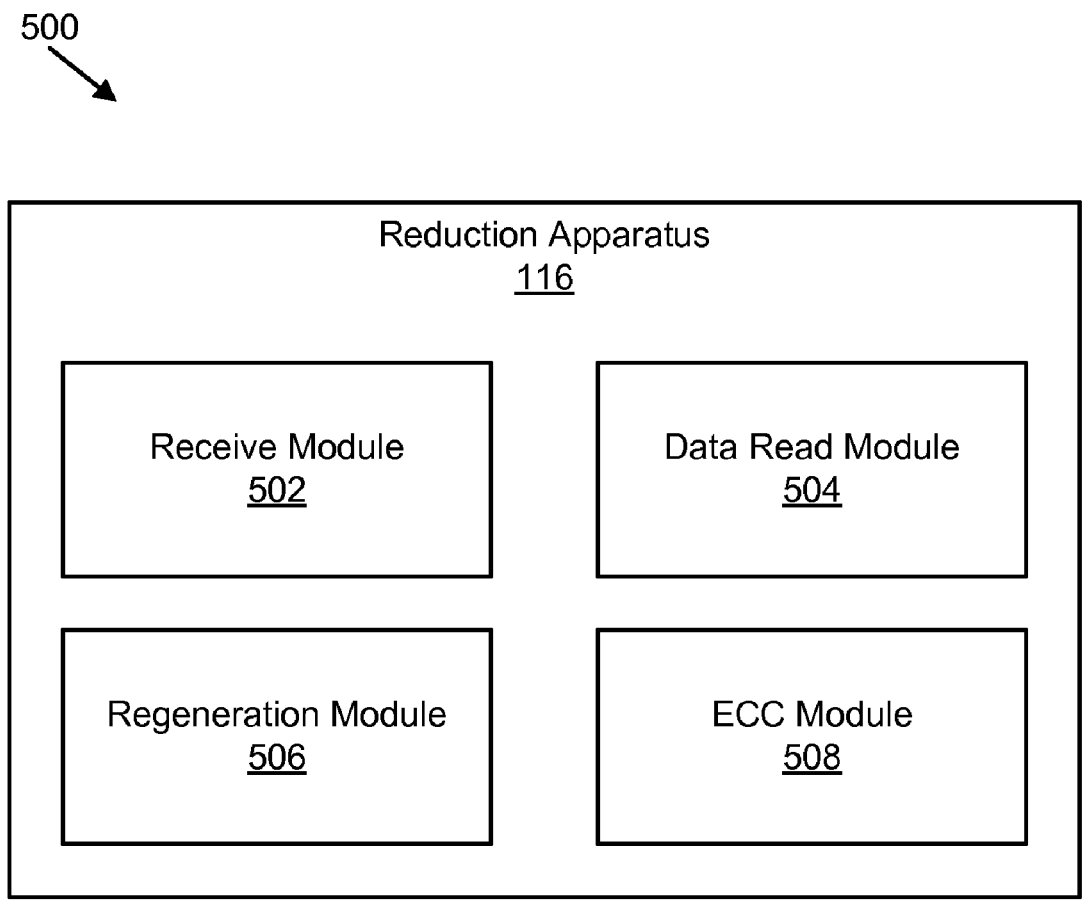
FIG. 5 is a schematic block diagram illustrating one embodiment of an apparatus to increase data integrity in a redundant storage system in accordance with the present invention.

FIG. 5 is a schematic block diagram illustrating one embodiment of an apparatus 500 to increase data integrity in a redundant storage system in accordance with the present invention. The apparatus 500 includes one embodiment of the reduction apparatus 116 and includes, in one embodiment, a receive module 502, a data read module 504, a regeneration module 506, and an ECC module 508, which are described below. The apparatus 500 is also described in U.S. patent application Ser. No. 12/468,041 entitled "Apparatus, System, and Method to Increase Data Integrity in a Redundant Storage System," filed on May 18, 2009 for Jonathan Thatcher, et al., which is incorporated herein by reference.

In one embodiment, the apparatus 500 includes a receive module 502 that receives a read request to read data ("requested data") from a logical page 416. The logical page 416 spans an array 400 of N+P number of storage elements 402 and may include one or more ECC chunks 418. In one embodiment, the receive module 502 receives a request to read data from a plurality of logical pages 416. N and P each represent a number of storage elements 402.

Each of the N number of the storage elements 402 store a portion of an ECC chunk 418 and the P number of the storage elements 402 store parity data. As shown in FIGS. 4A & 4B, the actual storage elements 402 storing parity data 408p may vary by page 406, 410, 412, LEB 414, or other storage division. The stored data in the one or more ECC chunks 418 may include the requested data. Furthermore, the parity data stored in the P number of storage elements 402 is generated from data stored in each of the ECC chunks 418. For example, if data and ECC from an ECC chunk 418 is lost or corrupted, the data or ECC may be recovered and restored by using the remaining data and ECC. The parity data may include simple XOR parity information or may be more complex and involve a plurality of storage elements 402 storing parity data as is known in the art. In one embodiment, the portion of the ECC chunk 418 stored on each of the N storage elements 402 is stored on at least a portion of a physical page 406 of each of the storage elements 402.

In one embodiment, the P number of storage elements 402 storing parity data include a data minor including a copy of the data stored in the N number of storage elements 402 instead of parity data. Therefore, data from the P number of devices with the mirrored data can be directly substituted instead of processed with parity calculations before restoring data for the N number of storage elements 402. In another embodiment, the data minor includes an inverse of the data such that each logical "1" has a corresponding logical "0" in the mirror and logical "0" has a logical "1" in the minor.

In one embodiment, the apparatus 500 includes a data read module 504 that reads data ("read data") from at least a portion of a physical page 406 on each of X number of storage elements 402 of the N+P number of storage elements 402 where X equals N. X represents a number of storage elements 402 read by the data read module 504 and is sufficient to recover the data. Therefore, the data read module 504 may read a subset (X) of the storage elements 402 in the array 400, the subset (X) equaling the total number of storage elements 402 (N+P) minus the number of storage elements 402 storing parity data (P).

The data read module 504 reads data in response to the receive module 502 receiving the read request. In one embodiment, the data read module 504 reads at least a portion of a physical page 406 on each of X number of storage elements 402 for every read request. The physical pages 406 that are read by the data read module 504 may include a portion of the logical page 416 requested by the read request.

In one embodiment, the data read module 504 reads data from the same storage elements 402 for each read. The storage elements 402 read by the data read module 504 may include portions of an ECC chunk 418 or a combination of data from an ECC chunk 418 and parity data 408p. By reading from the same storage elements 402, the data read module 504 maximizes data integrity on the storage elements 402 that are not initially read. The data in the storage elements 402 not read as part of a read request include data that may be later used to correct one or more errors.

In one embodiment, the data read module 504 reads data from the N number of storage elements 402 storing at least a portion of the ECC chunk 418 and does not read data from the P number of storage elements 402 storing parity data. As a result, the storage element 402 storing parity data is subjected to less reads than the other storage elements 402 and the parity data may have greater data integrity. The storage element 402 storing parity data may become more reliable than the non-parity storage elements 402 because the mean-time-to-failure of the parity storage element 402 becomes higher than the non-parity storage elements 402. Thus, when parity data is required for data substitution, better quality data is substituted.

In one embodiment, the data read module 504 determines which storage elements 402 to read. The data read module 504 may determine whether to read from physical pages 406 on storage elements 402 storing parity data, to read entirely from physical pages 406 that do not include parity data, or to read from storage elements 402 according to a user-configured pattern as is described in more detail below. By not reading all of the storage elements 402 on each read and only reading the amount of storage elements 402 required to obtain the requested data, the number of overall reads for the array 400 decreases. Therefore, the storage elements 402 do not wear out as fast and the data on the storage elements 402 is subject to less read disturbs, or bits that are activated when adjacent bits are read.

In one embodiment, the apparatus 500 includes a regeneration module 506 that regenerates missing data. Because the data read module 504 only reads from a physical page 406 from X number of storage elements 402, one or more of the storage elements 402 read by the data read module 504 may include parity data resulting in less than a whole ECC chunk 418 being read, thus resulting in "missing data." The regeneration module 506 uses the parity data read by the data read module 504 and a remainder of the read data that is not parity data to regenerate the missing data.

The regeneration module 506 substitutes the missing data into the ECC chunk 418, and this missing data combined with the remainder of the read data now comprise the ECC chunk 418. In instances where the data read module 504 does not read parity data, the regeneration module 506 is not required to regenerate missing data. The regeneration module 506 may, for example, regenerate missing data in response to a portion of the read data comprising parity data or from a signal from the read data read module 504 that parity data was read.

In one embodiment, the apparatus 500 includes an ECC module 508 that determines if the one or more ECC chunks 418 include errors. The ECC module 508 may use the ECC in each ECC chunk 418 to determine if the data in the ECC chunk 418 includes errors. The ECC chunks 418 may include the read data and any regenerated missing data. The ECC in each ECC chunk 418 may be used to detect and correct errors introduced into the data of the ECC chunk 418 through transmission and storage. Typically, ECC can detect a certain amount of errors and correct less than the amount of errors the ECC can detect. For example, the ECC can detect an error in six bits but can only correct three of the bit errors. Storage systems with data chunks including large amounts of data typically use advanced ECC with multi-bit ECC correction. An ECC with advanced, multi-bit ECC correction may detect an error in 16 bits and correct 8 of the bit errors. The ECC module 508 corrects the bits in error by changing the bits in error to the correct one or zero state so that the ECC chunk 418 is identical to when it was written to the solid-state storage 110 and the ECC was generated for the ECC chunk 418.

Figure 6:
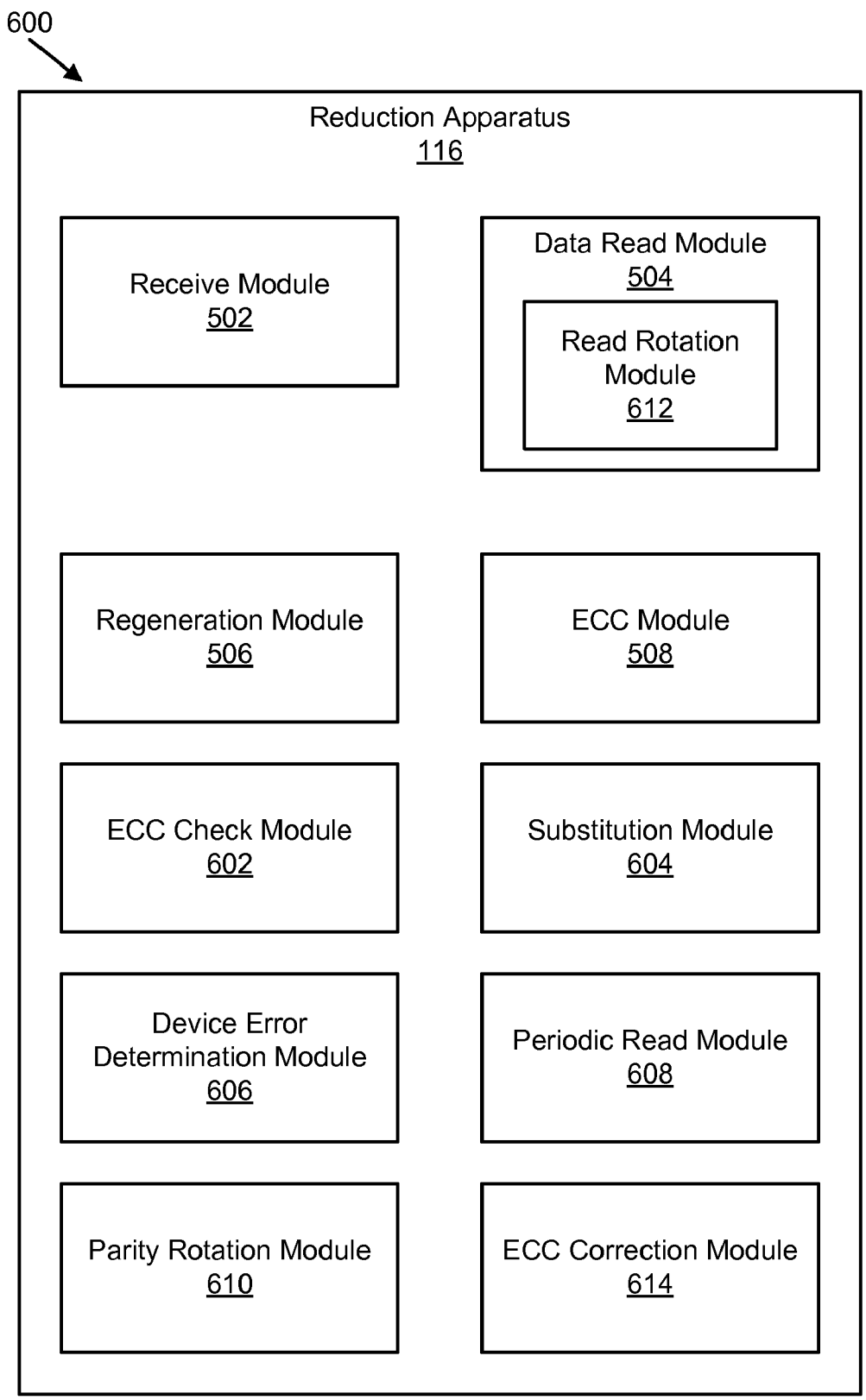
FIG. 6 is a schematic block diagram illustrating another embodiment of an apparatus to increase data integrity in a redundant storage system in accordance with the present invention.

FIG. 6 is a schematic block diagram illustrating another embodiment of an apparatus 600 to increase data integrity in a redundant storage system in accordance with the present invention. The apparatus 600 includes a reduction apparatus 116 with a receive module 502, a data read module 504, a regeneration module 506, and an ECC module 508, which are substantially similar to those described with respect to the apparatus 500 in FIG. 5. The apparatus 600, in various embodiments, may also include an ECC check module 602, a substitution module 604, a device error determination module 606, a periodic read module 608, a parity rotation module 610, a read rotation module 612, and an ECC correction module 614, which are described below.

In one embodiment, the apparatus 600 includes an ECC check module 602. If the ECC module 508 determines that an ECC chunk 418 included errors, the ECC check module 602 then determines if the errors are correctable using the ECC stored in the ECC chunk 418. The number of errors that can be corrected using the ECC is determined by the robustness of the ECC algorithm used to generate the ECC. If the errors in the ECC chunk 418 are more than can be corrected using the particular ECC stored in the ECC chunk 418, the ECC check module 602 determines that the errors are uncorrectable. ECC chunk 418 A condition of an ECC chunk 418 having more errors than are correctable using the ECC stored with the data may be indicative of a failure in a storage element 402.

In one embodiment, the apparatus 600 includes a substitution module 604. If the ECC check module 602 determines that the errors are uncorrectable using the ECC stored with the ECC chunk 418, the substitution module 604 reads data ("substitute data") from a storage element 402 not read by the data read module 504 and uses the substitute data and read data to replace data from a storage element 402 with errors to generate an ECC chunk 418 ("substitute ECC chunk 418") including either no errors or a number of errors that are then correctable using ECC in the substitute ECC chunk 41 8. The substitution module 604 reads data that was not previously read by the data read module 504 because the errors in the ECC chunk 418 cannot be corrected using the ECC in the ECC chunk 418.

In one embodiment, the storage element 402 not read by the data read module 504 is a storage element 402 storing parity data. The substitution module 604 may read a storage element 402 storing parity data to generate the substitute data. In another embodiment, the storage element 402 not read by the data read module 504 is a storage element 402 storing a portion of an ECC chunk 418 rather than parity data. The substitution module 604 may read the storage element 402 storing the portion of the ECC chunk 418 to use that portion of the ECC chunk 418 as substitute data or use the substitute data together with data read by the data read module 504 (including parity data) to replace data on a storage element 402 with errors.

In one embodiment, the apparatus 600 includes an ECC correction module 614 that uses the ECC and data from the ECC chunk 418 to correct errors in the data. If the ECC check module 602 determines that the errors are correctable in an ECC chunk 418, the ECC correction module 614 may then correct those errors using the ECC in the ECC chunk 418.

In another embodiment, the ECC check module 602 determines that errors in the ECC chunk 418 are not correctable. In one case where the storage element 402 determined to have errors stores parity data, data from the other storage elements 402 read by the data read module 504 plus ECC chunk data from the substitute storage element 402 comprise the ECC chunk 418 and the ECC correction module 614 then uses the ECC chunk 418 and corrects any errors in the data stored in the substitute ECC chunk 418. In the case where a storage element 402 not storing parity data is identified as having errors, the substitution module 604 uses substitute data and parity data from the data read by the data read module 504 to replace the data on the storage element 402 determined to have errors to create a substitute ECC chunk 418 that, in one embodiment, the ECC check module 602 can determine to have correctable errors or no errors. If correctable errors exist in the data of the substitute ECC chunk, the ECC correction module 614 uses the data from the substitute ECC chunk 418 to correct the errors in the data in the substitute ECC chunk 418.

In one embodiment, the apparatus 600 includes a device error determination module 606 that works in conjunction with the ECC check module 602 and the substitution module 604 to determine which storage element 402 includes data with the errors. The errors may be those that are uncorrectable using ECC in the ECC chunk 418. Errors that are uncorrectable using ECC may be signs of a faulty storage element 402 that may require retirement of the faulty storage element 402. Furthermore, as is described in greater detail below, because an ECC chunk 418 spans a plurality of storage elements 402, the storage element 402 from which the errors originated cannot be determined by the ECC alone. The device error determination module 606 may include one embodiment of the detection apparatus 118 described in greater detail below.

In another embodiment, the ECC within an ECC chunk 418 can correct many to all bits in error within a specific storage element 402. In this embodiment, this specialized ECC code may directly identify a storage element 402 that needs to be substituted. In the embodiment, the device error determination module 606 analyzes the output of the corrected data and determines from information provided from the ECC correction module 614 which of the storage elements 402 has failed.

In one embodiment, the apparatus 600 includes a periodic read module 608 that periodically reads data from the one or more storage elements 402 not read by the data read module 504. When storage elements 402 are not read by the data read module 504, the chance that latent defects or faults in those storage elements 402 will go undiscovered greatly increases. A latent fault remains undiscovered until the defective device is needed. Typically, latent faults are especially important in systems that have the redundancy and the ability to survive a certain number of faults. Latent faults create a situation where there is apparent redundancy that is false and a subsequent fault can cause the system to fail. Conversely, if the fault had been discovered, the failure might have been avoided through repair or reconfiguration in advance of the subsequent additional fault.

Normally, such latent faults may be detected with standard, periodic reads. However, when the data read module 504 does not read from certain storage elements 402 regularly, the periodic read module 608 may periodically read data from those storage elements 402.

The periodic read module 608 may read from lesser-used storage elements 402 according to a predetermined or user-configured pattern or according to a threshold. For example, the periodic read module 608 may track the amount of time since a storage element 402 was read or an overall number of reads for the storage element array 400 that do not include a read for the storage element 402. If the amount of time or overall number of reads meets a threshold, the periodic read module 608 may read the storage element 402. One of skill in the art will recognize other ways to determine when the periodic read module 608 reads from lesser-used storage elements 402.

In one embodiment, the apparatus 600 includes a parity rotation module 610 that alternates which storage elements 402 of the logical page 416 store parity data for a storage subset of each storage element 402. Each storage subset includes at least a portion of a storage element 402 and a logical storage subset includes a storage subset on each storage element 402 of the array 400. A storage subset may include a physical or logical portion of a storage element 402 including a portion of a physical page 406, a physical page 406, a portion of a physical erase block 404, a physical erase block 404, a device, a chip, or one or more dies.

By rotating the parity data, the parity rotation module 610 promotes wear leveling, as one dedicated storage element 402 is not constantly used to read and write parity data. Therefore, the parity data may be rotated at several levels of data storage. For example, a logical page 416 may include a row of physical pages 406 (e.g. 406a-m,p) where the parity data 408p is stored on a physical page 406a for a first storage element 402a. The parity data 408p in the next row of physical pages 410a-m,p of a next logical page 416 may be stored on a physical page 410b for a second storage element 402b. This pattern may continue for each logical page 416. In various embodiments, the parity rotation module 610 may rotate parity data 408p by page 406, 410, 412, by PEB 404, etc.

In one embodiment, for a logical storage subset, the parity rotation module 610 alternates which storage element 402 to store parity data after a storage space recovery operation. The storage space recovery operation may include copying valid data out of the logical storage subset and erasing the logical storage subset to prepare the logical storage subset for storing newly written data. One example of a storage space recovery operation is garbage collection. In this embodiment, the parity rotation module 610 may direct parity data 408p of each ECC chunk 418 to be stored in one PEB (e.g. PEB 1 404a) of an LEB 414 and then rotated to a different PEB (e.g. PEB 2 404b) of the same LEB 414 after a garbage collection process where valid data is copied from the LEB 414 and the LEB 414 is again made available for data storage.

In one embodiment, the data read module 504 reads data from the same storage elements 402 with each read and the parity rotation module 610 alternates which storage element 402 to store parity data. As a result, the data read module 504 will read parity data 408p when the parity rotation module 610 directs parity data 408p to be stored on the storage elements 402 read each time by the data read module 504.

In one embodiment, the data read module 504 includes a read rotation module 612 that rotates which X storage elements 402 of the N+P number of storage elements 402 from which the data read module 504 reads data. In one embodiment for a particular read, with N number of storage elements 402 storing data and a single P storage element 402 storing parity data, the data read module 504 reads N-1 storage elements 402 from among the N storage elements 402 storing the ECC chunk, and reads the storage element 402 storing parity data 408p. For another read, the data read module 504 may read the N storage elements 402a-n storing the ECC chunk 418. During a different read operation, the read rotation module 612 directs the data read module 504 to read different storage elements 402 of the same logical page 416. The read rotation module 612 rotates the X storage elements 402 read from among the N+P storage elements 402 for wear leveling and to reduce latent faults going undetected. One of skill in the art will recognize other ways to determine how the read rotation module 612 rotates storage elements 402 from which the data read module 504 reads data.

In one embodiment, the parity rotation module 610 alternates which storage elements 402 of the logical page 416 store parity data 408p for a storage subset of each storage element 402 and the read rotation module 612 rotates storage elements 402 of the X number of storage elements 402 from which the data read module 504 reads data. In certain embodiments, the read rotation module 612 rotates the storage elements 402 such that the data read module 504 reads data from the N number of storage elements 402 storing at least a portion of the ECC chunk 418 and does not read data from the P number of storage elements 402 storing parity data, regardless of where the storage elements 402 that store parity data are rotated. Therefore, although parity data is rotated, the parity data is still not read. The periodic read module 608 may then periodically read the storage elements 402 storing parity data. One of skill in the art will recognize the variety of ways in which the parity rotation module 610 and the read rotation module 612 may interact to rotate the storage elements 402 that are read.

Figure 7:
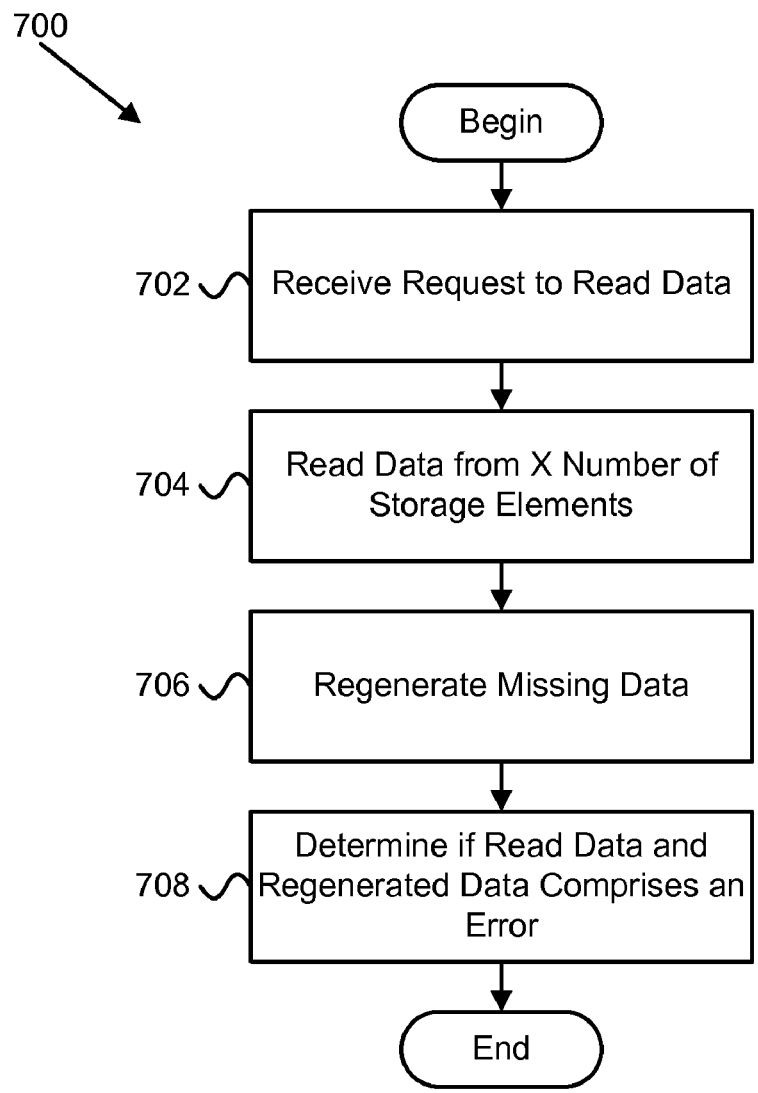
FIG. 7 is a schematic flow chart diagram illustrating one embodiment of a method to increase data integrity in a redundant storage system in accordance with the present invention.

FIG. 7 is a schematic flow chart diagram illustrating one embodiment of a method 700 to increase data integrity in a redundant storage system in accordance with the present invention. The method 700 begins and the receive module 502 receives 702 a read request to read requested data from a logical page 416 that spans an array of N+P number of storage elements 400. The array of storage elements 400 includes N number of the storage elements 402 that a store portion of an ECC chunk 418 and P number of the storage elements 402 storing parity data.

In response to the receive module 502 receiving 702 the read request, the data read module 504 reads 704 data from at least a portion of a physical page 406 on each of X number of storage elements 402 of the N+P number of storage elements 402 where X equals N. Therefore, the data read module 504 reads less than the total number of storage elements 402.

In response to a portion of the read data comprising parity data, the regeneration module 506 uses the parity data read by the data read module 504 and a remainder of the read data that is not parity data to regenerate 706 missing data if necessary. The data generated by the regeneration module 506 substitutes regenerated data for the missing data to provide a substitute ECC chunk 418 to the ECC module 508. The ECC module 508 determines 708 if the ECC chunk 418, including read data and any regenerated missing data, has errors and the method 700 ends.

Figure 8:
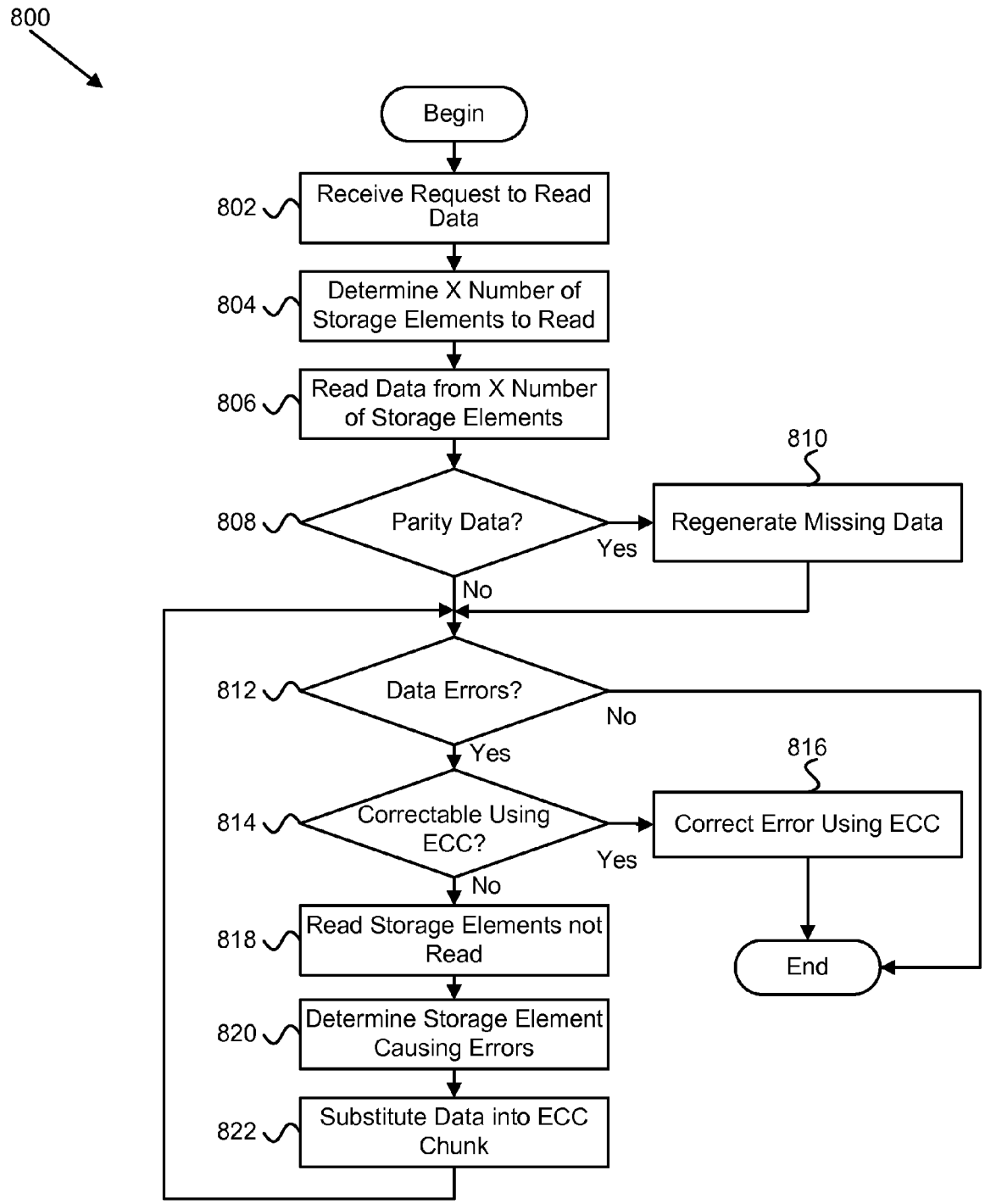
FIG. 8 is a schematic flow chart diagram illustrating another embodiment of a method to increase data integrity in a redundant storage system in accordance with the present invention.

FIG. 8 is a schematic flow chart diagram illustrating another embodiment of a method 800 to increase data integrity in a redundant storage system in accordance with the present invention. The method 800 begins and the receive module 502 receives 802 a read request to read requested data from a logical page 416 that spans an array of N+P number of storage elements 400. The array of storage elements 400 include N number of the storage elements 402 that a portion of an ECC chunk 418 and P number of the storage elements 402 storing parity data. Furthermore, the parity rotation module 610 may, for a storage subset of each storage element 402 on the array 400, alternate which storage elements 402 of the logical page 416 store parity data.

In response to the receive module 502 receiving 802 the read request, the data read module 504 determines 804 the X number of storage elements 402 from which to read. The data read module 504 may determine to only read storage elements 402 that do not store parity data. The data read module 504, through the read rotation module 612, may refer to a predetermined reading schedule or algorithm to determine the X number of storage elements 402 from which to read data.

The data read module 504 reads 806 data from at least a portion of a physical page 406 on each of the X number of storage elements 402 of the N+P number of storage elements 402 where X equals N. The regeneration module 506 determines 808 if a portion of the read data includes parity data. If the regeneration module 506 determines 808 that a portion of the read data comprises parity data, the regeneration module 506 regenerates 810 missing data to compensate for the portion of the ECC chunk 418 that was not read. If the regeneration module 506 determines 808 that a portion of the read data does not comprise parity data, the regeneration module 506 does not regenerate data.

The ECC module 508 determines 812 if the ECC chunk 418 includes any errors. The ECC chunk 418 includes read data and any regenerated missing data. If the ECC module 508 determines 812 that the ECC chunk 418 does not include any errors, the method 800 ends. Alternatively, if the ECC module 508 determines 812 that the ECC chunk 418 includes errors, the ECC check module 602 determines 814 if the errors are correctable using the ECC stored in the ECC chunk 418. If the ECC check module 602 determines 814 that the errors are correctable using the ECC, the ECC module 508 corrects 816 the errors using the ECC and the method 800 ends.

Alternatively, if the ECC check module 602 determines 814 that the errors are uncorrectable using the ECC, the device error determination module 606 reads 818 data from the one or more storage elements 402 not read by the data read module 504. The device error determination module 606 determines 820 which storage element 402 is causing the errors such that the ECC chunk 418 has too many errors to be correctable, as will be described below in the description related to the detection apparatus 118. The substitution module 604 substitutes 822 the substitute data the data from the storage element 402 that caused the data in the ECC chunk 418 to not be correctable and the method 800 returns and the ECC module 508 determines 812 if the substitute ECC chunk 418 has errors. In one embodiment (not shown) the device error determination module 606 cannot determine which storage elements 402 have errors and would send an error message.

Advantageously, the methods 700, 800 in FIGS. 7 and 8 allow data to be read from only the number storage elements 402 required to read an ECC chunk 418 so that P storage elements 402 are typically not read unless required to recover data in case of failure, malfunction, etc. The methods 700, 800 extend the life of the solid-state storage device 102 and may improve the quality of data stored in device 102 by reducing the number of read disturbs affecting data adjacent to the data read.

Detecting Failed Data Storage

Figure 9A:
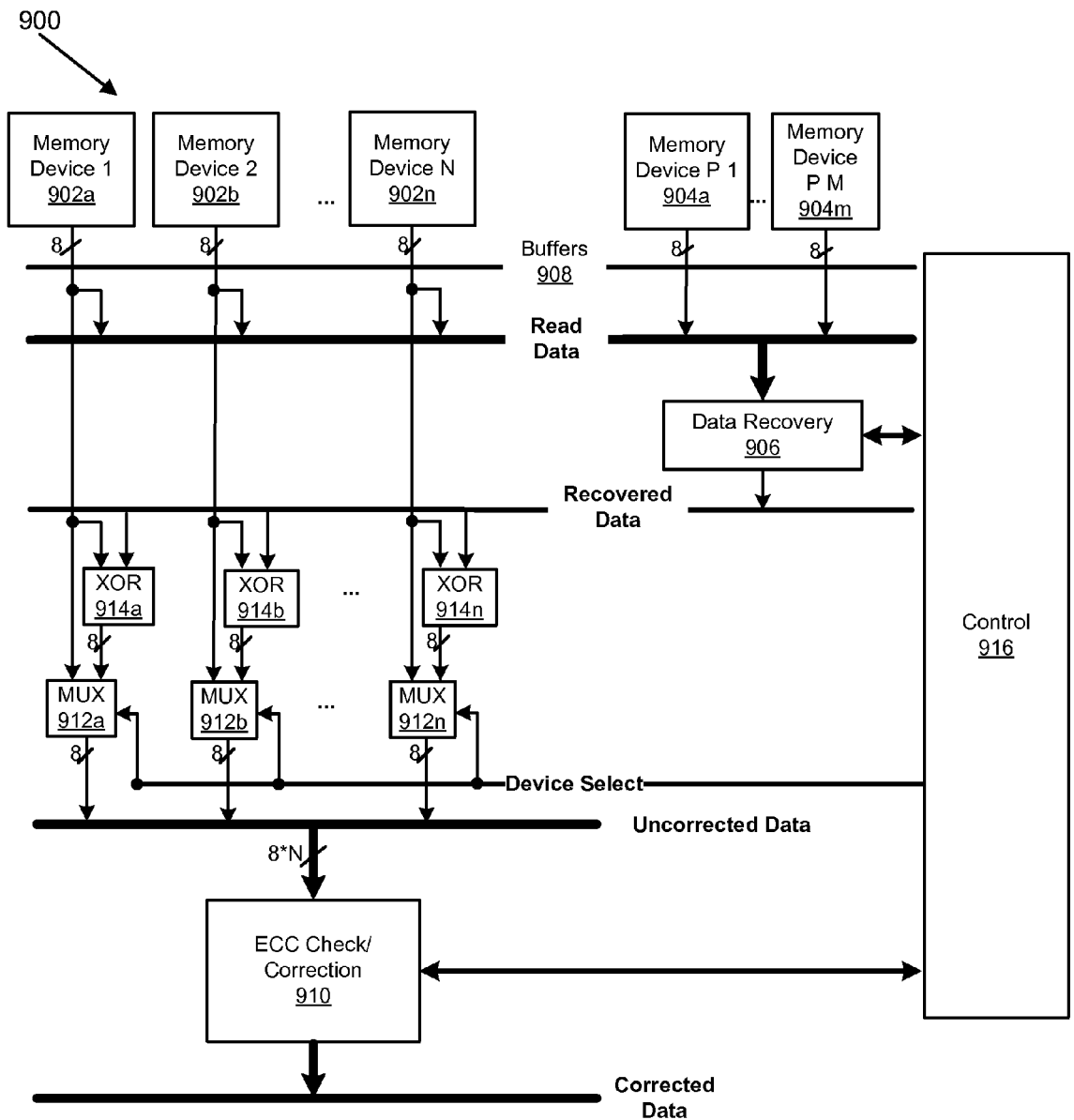
FIG. 9A is a schematic block diagram illustrating one embodiment of an apparatus for detecting and replacing failed data storage in accordance with the present invention.

FIG. 9A is a schematic block diagram illustrating one embodiment of an apparatus 900 for detecting and replacing failed data storage in accordance with the present invention. The apparatus 900 includes one embodiment of the detection apparatus 118. The apparatus may detect failures in data storage including solid-state storage 110 or any type of memory chip, volatile or non-volatile. Solid-state storage 110 such as NAND flash memory, has recently been found by solid-state drive manufacturers to have a high failure rate. Furthermore, as described above, when an ECC chunk 418 spans a plurality of storage elements 402, the storage element 402 from which the errors originated often cannot be determined by the ECC alone. The apparatus 900 is also described in U.S. Provisional Patent Application No. 61/054,055 entitled "Apparatus, System, and Method for Detecting and Replacing Failed Data Storage," filed on May 16, 2008 for David Flynn, et al. and U.S. patent application Ser. No. 12/467,914 entitled "Apparatus, System, and Method for Detecting and Replacing Failed Data Storage," filed on May 18, 2009 for David Flynn, et al., which are incorporated herein by reference.

The apparatus 900 locates a failed memory chip or portion of a chip ("memory device 902") in an array of memory devices 902 and then substitutes data from another memory device 904 or portion of a memory device 904. The architecture includes an array of memory devices 902 with one or more extra devices 904. In one embodiment, a memory device 902, 904 is solid-state storage and the memory device 902, 904 may be called a storage element 402. Hereinafter "memory device" and "storage element" may be used interchangeably and both a memory device 902, 904 and a storage element 402 may be solid-state storage or some other type of volatile or non-volatile storage unless indicated otherwise. Each memory device 902 may include a storage element 402 as described above. Furthermore, the array of memory devices 902a-n may include an array of N+P number of storage elements 400 as described above. Specifically, the array of storage elements 400 may include N number of the storage elements 402 each storing a portion of an ECC chunk 418 and P number of the storage elements 402 storing parity data. As stated above, an ECC chunk 418 stores data and ECC generated from the data. The ECC check/correction circuitry 910 uses the ECC stored in the ECC chunk 418 to determine if errors in the data exist. The ECC check/correction circuitry 910 may include one embodiment of the ECC check module 602 and/or the ECC correction module 614 described above.

The memory devices 902, 904 may be identical in structure, size, etc. Typically the memory devices 902, 904 are memory chips, but may also be a group of chips, a DIMM, etc. The memory devices 902 may include the N number of storage elements 402 as described above. Parity information is stored in the extra memory devices 904. Furthermore, the extra memory devices 904 may include the P number of storage elements 402 storing parity data as described above. If a single extra memory device 904a is included, the extra memory device 904a may typically include simple parity information generated from the array of memory devices 902a-n. If multiple extra memory devices 904a-m are used, multidimensional parity or other more complex parity information may be stored in the extra memory devices 904a-m. In another embodiment, the multiple extra memory devices 904a-m store simple parity data. For example, each extra memory device 904 may include the same parity data. The memory devices 902, 904 may be volatile memory, such as static random access memory ("static RAM"), dynamic RAM ("DRAM"), and the like or may be non-volatile memory, such as flash memory, nano random access memory ("nano RAM or NRAM"), magneto-resistive RAM ("MRAM"), phase change RAM ("PRAM"), Racetrack memory, Memristor memory, etc.

The parity information stored in the extra memory device(s) 904 is typically derived using an exclusive OR ("XOR") operation with data from the memory devices 902a-n in the array as input. When data is read from the array 902, 904, it is typically read in parallel so a portion of the data is read from each memory module 902 of the array. For simplicity, this embodiment reads all of the data in the memory array 902, 904. This design can read less than the total number of memory devices 902,904 in order to increase data integrity as described above.

ECC (not including the parity information) is used to determine if the data read from the memory devices 902 is valid. The ECC may be located in a plurality of ECC chunks 418 where the ECC in each ECC chunk 418 corresponds to the data in the ECC chunk 418. Furthermore, an ECC chunk 418 may span the plurality of memory devices 902a-n. If the ECC is used by the ECC check/correction circuitry 910 to determine that the data is valid or if the data contains errors that are correctable using the ECC, the valid data or corrected data is passed on with no further action by the apparatus 900.

If, however, the ECC check/correction circuitry 910 finds that the data is invalid and there are more errors than can be corrected by the ECC, similar to situations described above in relation to the reduction apparatus 116, there is a high probability that all or a portion of one or more of the memory devices 902a-n has failed. In this case, the parity information from the extra memory device(s) 904 is substituted for each memory device 902a-n, one at a time to discover which memory device 902 is not functioning or includes a large amount of erroneous data. The data recovery 906 includes XOR logic that allows the parity information to be substituted so that valid data for the memory device 902 being tested is replaced by data derived from the extra parity device 904.

In one example, four memory devices 902a-d are in an array, with stored data, A, B, C, and D, along with one extra memory device 904a with parity data P. To generate the parity information P, the data is XORed: P=A^B^C^D (not shown, "^" is an XOR operation) and P is stored in the extra memory device 904a. Assume, for example, that the third memory device 902c is bad such that the data A, B, C, D cannot be corrected with the ECC. Corrupted data C' will be read and the ECC check/correction circuitry 910 will use the ECC to determine that the data A, B, C', D is corrupted and cannot be corrected. Where the data A, B, C', D is stored such that an ECC chunk 418 spans the memory devices 902a-n, with a portion of the ECC chunk 418 stored on each memory device 902, the apparatus 900 may not be capable of detecting from the ECC alone that all or a portion of the third memory device 902c has failed or has too many errors to be corrected.

In the embodiment depicted in FIG. 9A, a MUX 912 and XOR logic 914 are included with each memory device 902. Each MUX 912 is able to select data from its memory device 902 or data from the associated XOR 914. Each XOR 914 combines read data and parity data from the data recovery 906. The data recovery 906 includes the parity information XORed with the read data. The read data is typically buffered 908 so that it will not be changing if an error in a memory device 902, 904 exists. The MUXes 912 and the XORs 914 may include one embodiment of a portion or all of the regeneration module 506 and/or the substitution module 604.

The control signals to leave a memory device 902, 904 deselected are not shown. When not selected, the associated MUXes 912 for the memory device 902 not read would be simultaneously selected and the missing data would be regenerated by the data recovery 906.

The apparatus 900 tests each memory device 902a-n by selecting data from the XOR 914 instead of the data read from the memory device 902. The process repeats for every memory device 902a-n until the ECC chunk is determined to be correctable. The apparatus 900 may control the data and memory device 902 selection through the control 916. The control 916 may control the logic that selects/deselects the data and iterate to isolate the faulty memory device 902 or portion of a memory device 902. Furthermore, the control 916 may include one embodiment of the device error determination module 606, the parity rotation module 610, and the read rotation module 612.

Continuing with the example, if the first memory device 902a is tested first, the first MUX 912a selects the XOR 914a data. In this example, the data recovery 906 will be A^B^C^D^P. Substituting what P represents, data recovery 906 is A^B^C^D^A^B^C^D=(A^A)^(B^B)^(C^C)^(D^D)= 0^0^C^C'^0=C^C'. This is XORed with the read data A from the first memory device 902a: A^C^C'. Since C and C' do not cancel, the result is A' and the result will be corrupted and the ECC check/correction circuitry 910 will still detect an uncorrectable error. This process repeats for each memory device 902.

When the third memory device 902c is tested, corrupted data C' is read from the third memory device 902c and XORed together with the other memory devices 902a, 902b, 902d: Data recovery 906=A^B^C'^D^P. Substituting what P represents: Data recovery 906=A^B^C'^D^A^B^C^D=(A^A)^ (B^B)^(C^C)^(D^D). Data XORed with itself is zero so XOR=0^0^C'^C^0=C'^C. If the third MUX 912c selects the third XOR 914c data instead of the data directly from the third memory device 902c, the data at the MUX 912c is the XOR of the data C' of the third memory device 902c and the output of the Data Recovery XOR 906: C'^(C'^C)=C. Thus the correct data C is substituted for the invalid data C'. At this point, the ECC check/correction circuitry 910 typically determines that the data is valid or correctable.

Once the data is determined to be valid or correctable, the memory device 902c that was selected at that time when the data is determined to be correctable by the ECC is then determined to be the failed memory device 902c. At this point, the MUX 912c for the failed memory device 902c is permanently selected and the extra memory device 904a with parity information is utilized to provide data in place of the failed memory device 902c for at least a region of the memory device 902c with the failure. The region may be a page, multiple pages, a PEB, multiple PEBs, a die, a chip or any other division within the memory device 902c or may even include the entire memory device 902c. Parity data is still stored in the extra memory device 902c and the process above is used to derive correct data C to be used in place of corrupted data C' from the extra memory device 904a.

In the example above, when the apparatus 900 determines a memory device 902c contains erroneous data, data from the memory device 902c with corrupted data C' may be substituted with corrected data derived from the extra memory device 904a. While this process corrects erroneous data, it substitutes one memory module 904 for another 902. The present invention also includes substituting any subset (region) of storage locations within a memory device 902 with matching data from the extra memory devices 904 by analyzing the memory locations in error as described below.

For example, once the apparatus 900 detects an uncorrectable error with the ECC check/correction circuitry 910, isolates the error, and fixes the data, the apparatus 900 may log the error with information such as memory location. Each time an error occurs, the error information is logged and then analyzed to isolate the error to a particular page, block, logical erase block, etc. Once an area in a memory device 902 is determined, the apparatus may cordon off that area and substitute data from the extra memory device(s) 904 until the memory device 902 with the failed area is replaced. Error logging is described in greater detail below.

The present invention anticipates many other ways to accomplish the steps of detecting an uncorrectable error, using parity data to selectively isolate the error, and then using data in an extra memory device 904 to correct erroneous data. While the examples depicted in FIGS. 9A and 9B indicate data buses of 8 bits, the present invention anticipates other arrays with wider or narrower data buses.

Figure 9B:
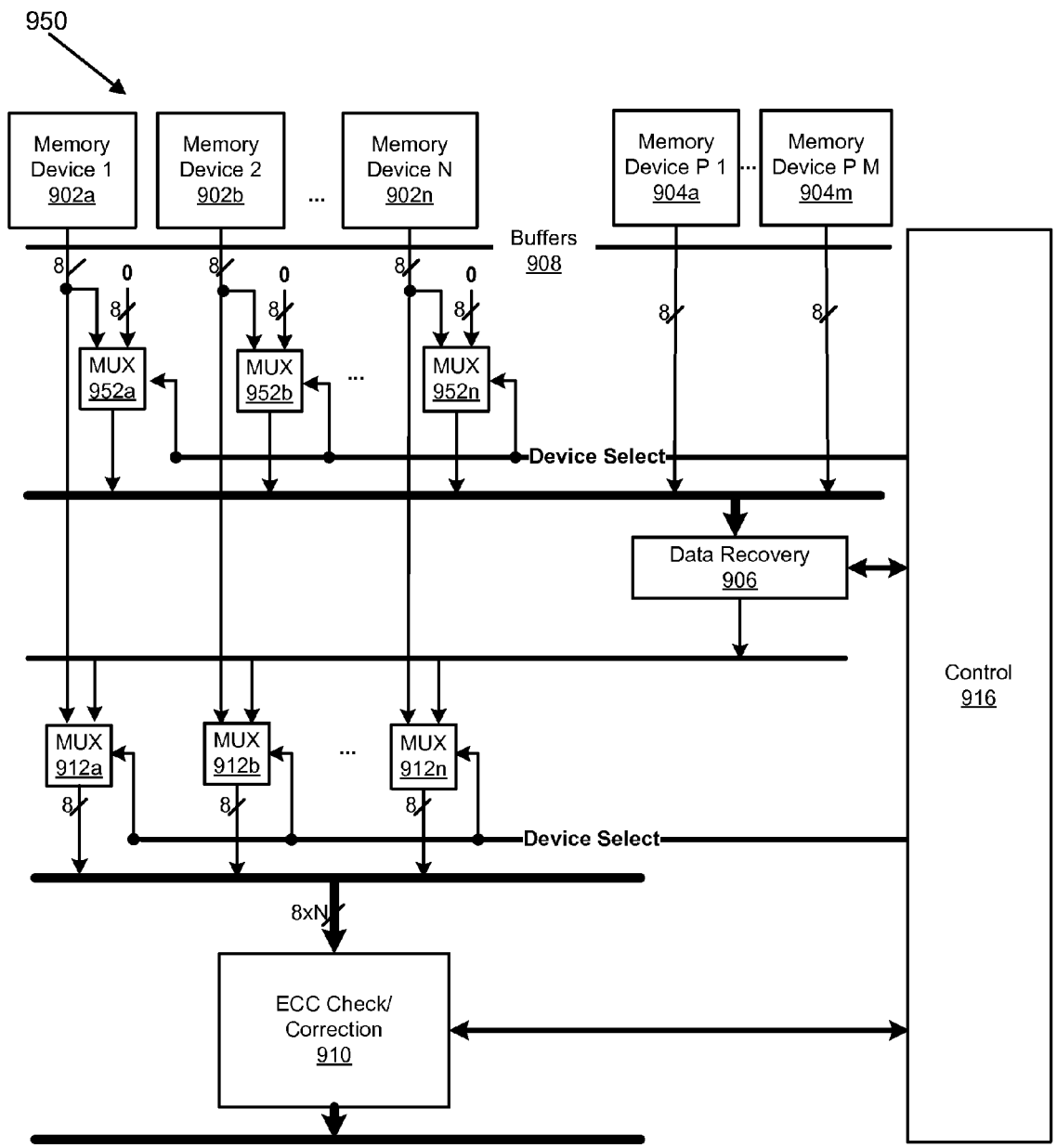
FIG. 9B is a schematic block diagram illustrating another embodiment of an apparatus for detecting and replacing failed data storage in accordance with the present invention.

FIG. 9B is a schematic block diagram illustrating another embodiment of an apparatus 950 for detecting and replacing failed data storage in accordance with the present invention. In the embodiment of the apparatus 950, the XOR 914 above the MUXes 912 are removed and data from the data recovery 906 is directly input to the MUXes 912. A second set of MUXes 952 receive read data from the memory devices 902 and from a set of data lines that are grounded to provide a logic "0."

When isolating an error, one set of MUXes (e.g. 952a, 912a) are set to not select data from the appropriate memory device (e.g. 902a). Returning to the example above, again an array includes data A, B, C, D and parity P, and parity is generated in the same way as in FIG. 9A (e.g. P=A^B^C^D). Again assume the third memory device 902c is corrupted so C' is read. If the first memory device 902a is selected for isolation, the first MUX 952a below the memory device 902a will read all zeros. The data recovery block will then XOR the data and parity: data recovery $906 = 0\hat{\ }B\hat{\ }C''\hat{\ }D\hat{\ }P = 0\hat{\ }B\hat{\ }C''\hat{\ }D\hat{\ }A\hat{\ }B\hat{\ }C''\hat{\ }D = (0\hat{\ }A)\hat{\ }(B\hat{\ }B)\hat{\ }(C''\hat{\ }C)\hat{\ }(D\hat{\ }D) = A\hat{\ }0\hat{\ }C''\hat{\ }C\hat{\ }0 = A\hat{\ }C''\hat{\ }C = A'$. This is then fed to the second MUX 912a. The ECC check/correction circuitry 910 will continue to detect an uncorrectable error.

When the third memory device 902c is selected, the data recovery output is $A\hat{\ }B\hat{\ }0\hat{\ }D\hat{\ }P = A\hat{\ }B\hat{\ }0\hat{\ }D\hat{\ }A\hat{\ }B\hat{\ }C\hat{\ }D = (A\hat{\ }A)\hat{\ }(B\hat{\ }B)\hat{\ }(0\hat{\ }C)\hat{\ }(D\hat{\ }D) = 0\hat{\ }0\hat{\ }0\hat{\ }C\hat{\ }0 = C$. The second MUX 912c in the third memory device 902c line then selects the data recovery 906 output, which is C so the ECC check/correction circuitry 910 typically detects valid data A, B, C, and D. The error may then be logged for analysis or garbage collection or the third memory device 902c may be deselected and data from the extra memory device(s) 904 may be used to provide corrected data.

One of skill in the art will recognize other circuits that will accomplish the steps of detecting an uncorrectable error using ECC check/correction circuitry 910 and ECC stored in an ECC chunk 418, isolating the error by sequentially selecting memory devices 902 and using parity data to substitute corrected data, and then correcting the error once a memory device 902 is selected and the ECC check/correction circuitry 910 determines the data is valid or correctable. In addition, the invention described herein anticipates an embodiment where multiple memory devices 902 are faulty or contain bad data and a complex substitution pattern is used with data from multiple extra memory devices 904 to locate the faulty memory devices 902. In the embodiment, parity data from multiple extra memory devices 904 is used to create data to substitute for data of a corresponding number of memory devices 902 in a rotation scheme until the memory devices 902 are found such that any errors in the ECC chunk 418 are correctable.

Figure 10:
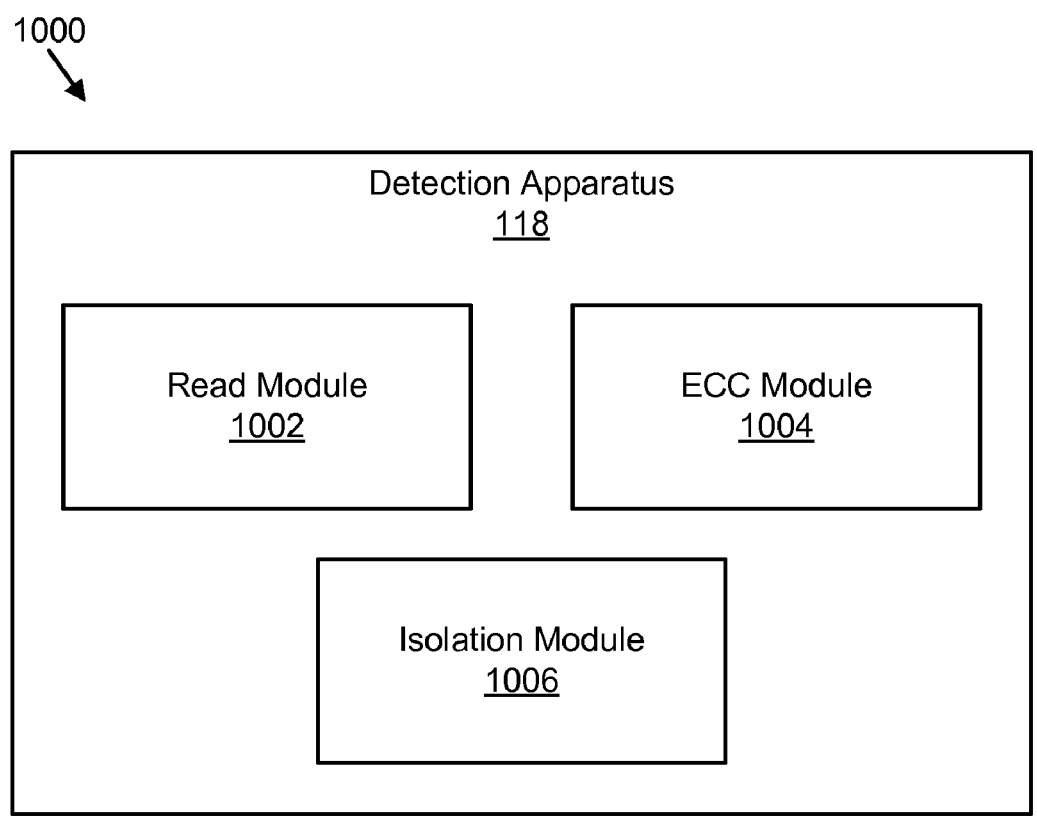
FIG. 10 is a schematic block diagram illustrating another embodiment of an apparatus for detecting and replacing failed data storage in accordance with the present invention.

FIG. 10 is a schematic block diagram illustrating another embodiment of an apparatus 1000 for detecting and replacing failed data storage in accordance with the present invention. The apparatus 1000 includes one embodiment of the detection apparatus 118 and includes, in one embodiment, a read module 1002, an ECC module 1004 and an isolation module 1006, which are described below.

In one embodiment, the apparatus 1000 includes a read module 1002 that reads data from an array of memory devices. The array comprises two or more memory devices 902 and one or more extra memory devices 904 that store parity information from the memory devices 902. In some embodiments, the read module 1002 reads the data from at least a portion of a logical page 416 that spans the array of memory devices 902, 904. In addition, the array of memory devices 902, 904 may include an array 400 of N+P number of storage elements 402. As described above, the array 400 of storage elements 402 may include N number of the storage elements 402 each storing a portion of an ECC chunk 418 and P number of the storage elements 402 storing parity data.

As described in greater detail below regarding the isolation module 1006, data from a selected memory device 902 under test will not be used but will be replaced. Therefore, in one embodiment, the read module 1002 reads from at least a portion of a physical page 406 on each of X number of storage elements 402 of the N+P number of storage elements 402 where X equals (N+P)−1. The storage element 402 not read is the selected storage element 402 under test.

In one embodiment, the apparatus 1000 includes an ECC module 1004 that determines, using an error correcting code ("ECC"), if one or more errors exist in tested data, and if the errors are correctable using the ECC. The tested data may include data read by the read module 1002. In some embodiments, the ECC is stored in an ECC chunk 418 along with the data read by the read module 1002. The data is used to generate the ECC stored with the data in the ECC chunk 418. Therefore, test data may include an ECC chunk 418, such as that read by the read module 1002 or that generated by the isolation module 1006 described in greater detail below.

In one embodiment, the apparatus 1000 includes an isolation module 1006 that selects a memory device 902 from the array of memory devices in response to the ECC module 1004 determining that errors exist in the data read by the read module 1002 and that the errors are uncorrectable using the ECC. Uncorrectable errors existing in the data may be indicative of a memory device 902/storage element 402 that is faulty.

The isolation module 1006 replaces data read from the selected memory device 902 with data including data generated from the parity data stored on the one or more extra memory devices 904 ("replacement data") and data read from the memory devices 902 that are not selected ("available data"). In one embodiment, the isolation module 1006 uses XOR logic to substitute data for the selected memory device 902 being tested with data derived from replacement data and available data.

In another embodiment, the ECC within an ECC chunk 418 can correct many to all bits in error within a specific memory device 902. In this embodiment, this specialized ECC code may directly identify the memory device 902 that originates the errors. In the embodiment, the isolation module 1006 analyzes the output of the corrected data and determines from information provided from the ECC module 1004 which of the memory devices 902 have failed.

Furthermore, the isolation module 1006 iterates through the memory devices 902 to find the memory device 902 from which the uncorrectable errors originate. Specifically, the isolation module 1006 selects a next memory device 902 for testing in response to the selected memory device 902 not being detected with the uncorrectable errors as is explained in greater detail below. The next memory device 902 may include a memory device 902 to select and test after de-selecting the memory device 902 that was tested. Therefore, the isolation module 1006 selects each of the memory devices 902 for testing until the memory device 902 in error is found or until all the memory devices 902 have been tested. In one embodiment, the isolation module 1006 returns or reports an error if all the memory devices 902 have been selected and tested without detecting a faulty memory device 902. In such a case, a plurality of memory devices 902 may be in error and further action by a user may be required. In one embodiment, the isolation module 1006 may store the identity of memory devices 902 that have previously failed so that the isolation module 1006 does not have to subsequently iterate through those memory devices 902. The isolation module 1006 may include the control 916 depicted in FIG. 9A and FIG. 9B.

The ECC module 1004 determines if the test data, now the available data combined with the replacement data, contains either no errors or errors such that the errors are correctable using the ECC. The fact that the available data combined with the replacement data contains no errors or errors such that the errors are correctable using the ECC may indicate that the selected memory device 902 whose data was replaced, was the memory device 902 from which the errors originated.

Once the data is determined to be valid or correctable, the memory device 902 that was selected at that time when the data is determined to be correctable by the ECC is then determined by the apparatus 1000 to be the failed memory device 902 and is hereinafter the "selected memory device 902 in error." If the available data combined with the replacement data is valid and contains no errors, the selected memory device 902 in error for which isolation module 1006 replaced the data is the cause of the errors. Similarly, if the only errors that remain are correctable using the ECC, the uncorrectable errors typically originated from the selected memory device 902 for which isolation module 1006 replaced the data.

Note that while FIGS. 9A and 9B show specific memory devices 902 storing data and specific memory devices 904 storing parity data, as explained above with respect to the reduction apparatus 116, the parity data may be rotated by page, erase block, etc. so that for one page the extra memory devices 904 may be at the end of the array, for the next page the extra memory devices 904 may be the first devices in the array, and the like. The memory devices 904 storing parity data may be shifted based on a parity rotation scheme and circuitry as shown in FIGS. 9A and 9B or similar circuitry may allow any device in the array to store parity data to be used to substitute for another memory device 902.

Figure 11:
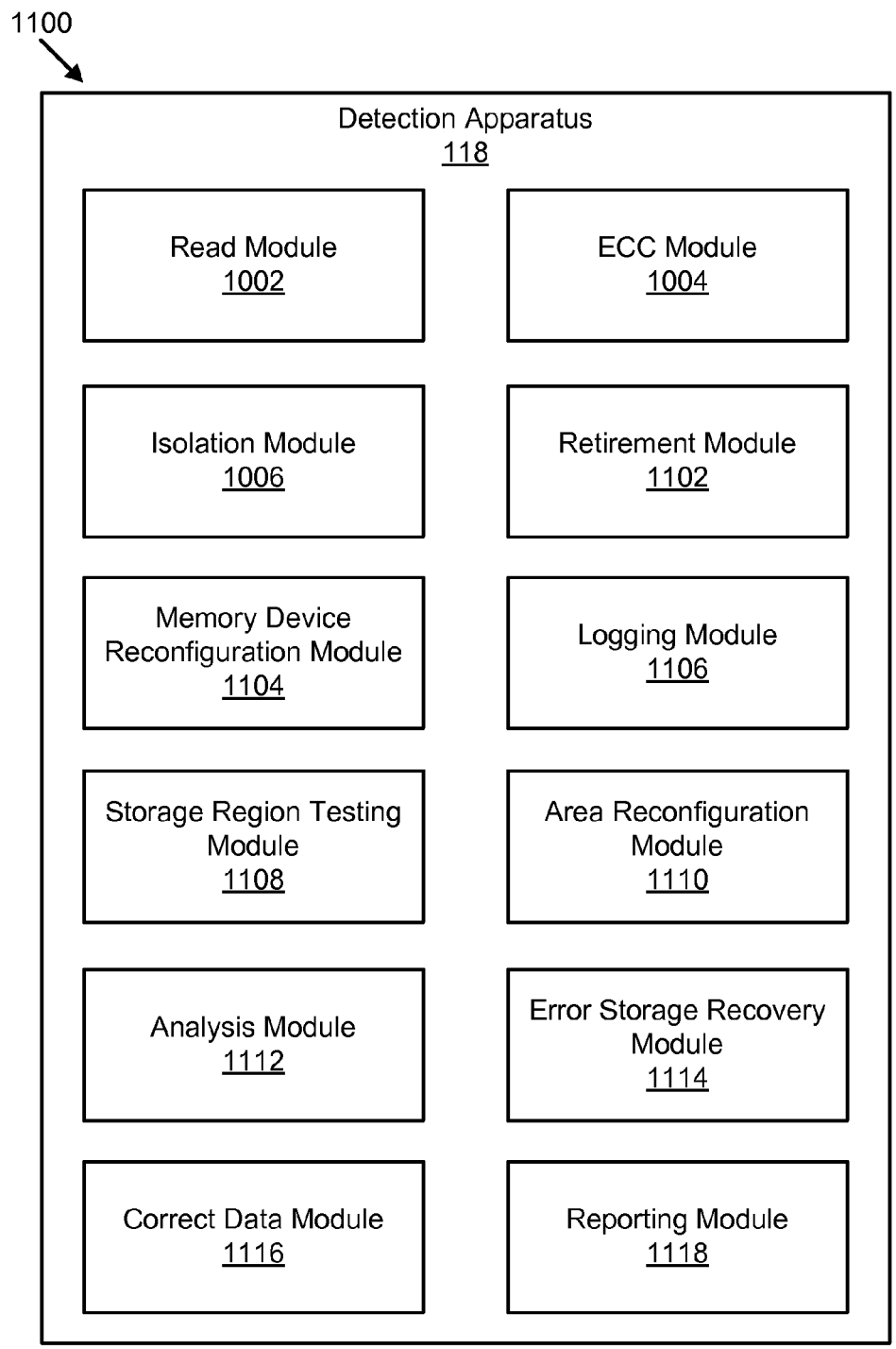
FIG. 11 is a schematic block diagram illustrating another embodiment of an apparatus for detecting and replacing failed data storage in accordance with the present invention.

FIG. 11 is a schematic block diagram illustrating yet another embodiment of an apparatus 1100 for detecting and replacing failed data storage in accordance with the present invention. The apparatus 1100 includes a read module 1002, an ECC module 1004 and an isolation module 1006, which are substantially similar to those described with respect to the apparatus 1000 in FIG. 10. The apparatus 1100, in various embodiments, may also include a retirement module 1102, a memory device reconfiguration module 1104, a logging module 1106, a storage region testing module 1108, an area reconfiguration module 1110, an analysis module 1112, an error storage recovery module 1114, a correct data module 1116, and a reporting module 1118, which are described below.

In one embodiment, the apparatus 1100 includes a retirement module 1102. In response to the ECC module 1004 determining a selected memory device 902 in error, the retirement module 1102 retires the selected memory device 902 or one or more storage regions on the selected memory device 902. The storage regions, which include physical or logical areas on the memory device 902 and include at least a portion of the selected memory device 902, may be retired if they include one or more errors. A storage region may include one portions of one or more ECC chunks 418, one or more physical pages 406, one or more logical pages 416, one or more physical erase blocks 404, one or more logical erase blocks 414, a chip, a portion of a chip, a portion of one or more dies, one or more dies, or any other portion of a memory device 902/storage element 402.

The retirement module 1102 may retire a selected memory device 902 or storage region ("retired storage") by permanently or temporarily taking the retired storage out of standard use. In one embodiment, the retirement module 1102 retires retired storage by signaling to the storage controller that the retired storage is no longer available for standard reads and writes. The retired storage may then be tested further, permanently shut down, or tracked based on the retirement policy. The retirement module 1102 may even erase the retired storage and allow continued operations on the retired storage while monitoring the retired storage for further errors. One of skill in the art will recognize other ways to retire storage.

The retirement module 1102 may base retirement determination on a retirement policy. A retirement policy, in one embodiment, includes the rules, user preferences, and logic to determine when retired storage is retired, how retired storage is retired, and the like. The retirement policy may include criteria for retirement, different levels of retirement, and strategies for retirement. For example, the retirement policy may specify that after a certain amount of errors or level or seriousness of errors, retired storage is temporarily suspended from standard operations and marked for a testing protocol. In another example, the retirement policy may specify that an alert is sent to a user after a certain amount of errors.

In certain embodiments, the retirement module 1102 may mark a storage region after an error, but then allow the storage region to be recovered with a storage space recovery operation such as garbage collection. For example, an erase block with errors may be erased and subsequent data may be written to the erase block. If additional errors are identified in the erase block using the ECC module 1004 and the isolation module 1006, the erase block may be permanently retired.

In one embodiment, the retirement policy specifies a macro-retirement strategy, or "top-down" approach to retired storage. Specifically, macro-retirement may assume that an initial area is defective, the initial area including a larger area of storage than is actually defective. The initial area may include a storage region on a selected memory device 902 in error or the entire device. Macro-retirement may then narrow the initial area to storage regions actually defective with further testing. In one embodiment, macro-retirement specifies that when a selected memory device 902 is in error, the entire memory device 902 is retired. At this point, the retirement module 1102 may implement further testing to determine the extent of the errors on the memory device 902. The retirement module 1102 may further isolate the errors to storage regions on the memory device 902. The storage regions on the memory device 902 not affected by the errors may be put back into standard use. Therefore, under macro-retirement, the retired storage regions are focused and isolated through additional testing.

In another embodiment, the retirement policy specifies a micro-retirement strategy, or "bottom-up" approach to retired storage. Specifically, micro-retirement may begin with an initial area that is known or assumed to be defective and enlarge the initial area to include other storage regions that are defective. In one embodiment under micro-retirement, only the storage regions with the errors are initially retired instead of the entire memory device 902. The retirement module 1102 may further test or monitor standard reads on adjacent storage regions for additional errors. If additional errors are found, the retirement module 1102 may further retire additional storage regions on the memory device 902 or increase the size of the retired storage region. The retirement module 1102 may work in cooperation with other modules as will be described hereafter to locate errors on and monitor memory devices 902.

In one embodiment, the apparatus 1100 includes a memory device reconfiguration module 1104 that identifies the selected memory device 902 in error such that data is generated to replace read data from the selected memory device 902 for future operations. As stated above, the selected memory device 902 in error may be the memory device 902 that was selected in response to the ECC module 1004 determining that the available data combined with the replacement data contains one of no errors and errors that are correctable using the ECC. The memory device reconfiguration module 1104 may cooperate with the retirement module 1102 to permanently or temporarily replace data from a retired memory device 902 with available data combined with replacement parity data as described in FIGS. 9A and 9B.

In one embodiment, the apparatus 1100 includes a logging module 1106. In response to a selected memory device 902 in error, the logging module 1106 logs an identity of the selected memory device 902 and/or logs memory location data specifying one or more storage regions comprising one or more errors. Each time an error occurs, the error information may be logged by the logging module 1106 and then analyzed to isolate the error to a particular storage region such as a page, block, erase block, etc. Once a storage region in a memory device 902 is determined, the apparatus 1100 may isolate off that area and substitute data from the extra memory device(s) 904 until the selected memory device 902 in error is replaced.

The logging module 1106 may operate in cooperation with the retirement module 1102 to track errors in memory devices 902 or storage regions. For example, according to macro-retirement, the logging module 1106 may log the identity of the selected memory device 902 in error without logging memory location data comprising a storage region with one or more errors because the logging module 1106 starts with a larger area before isolating the errors. The logging module 1106 may also log memory location data for one or more storage regions identified by further testing of the storage regions by the storage region testing module 1108 as described below to narrow the region of the memory device 902 that is known to be in error.

In another embodiment, the logging module 1106, instead of logging the identity of the selected memory device 902 in error, logs one or more storage regions including one or more errors on the memory device 902 in accordance with micro-retirement. Therefore, the entire memory device 902 may not be logged as being in error, but only the storage regions that include errors. Furthermore, in response to subsequent reads by the read module 1002 and using the ECC module 1004 and the isolation module 1006 to determine additional storage regions with uncorrectable errors that are correctable by combining replacement data with available data, the logging module 1106 may also log memory location data specifying one or more additional storage regions comprising one or more errors in the selected memory device 902. The subsequent read may include a read initiated by a storage region testing module 1108 to target specific additional storage regions for testing as described below. In addition, the subsequent read may include a standard read from a read request.

In one embodiment, the apparatus 1100 includes a storage region testing module 1108 that identifies one or more storage regions comprising errors within the selected memory device 902. The storage region testing module 1108 may test storage regions within the memory device 902 logged by the logging module 1106 according to macro-retirement. Therefore, the storage region testing module 1108 may further isolate areas on the memory device 902 that include errors by identifying storage regions with one or more errors with subsequent reads by the read module 1002 and using the ECC module 1004 and the isolation module 1006 to replace data on the tested storage regions and determine storage regions with uncorrectable errors that are correctable by combining replacement data with available data as described above for the specific storage region under test.

For example, the logging module 1106 logs the identity of the memory device 902 in error according to macro-retirement, the retirement module 1102 retires the selected memory device 902 in error by taking the selected memory device 902 out of standard use and assigns the selected memory device 902 for further testing, and the storage region testing module 1108 identifies storage regions within the memory device 902 that are in error. The storage region testing module 1108 may target specific storage regions for testing, such as storage regions adjacent to those in error. In addition, the storage region testing module 1108 may expand or contract the storage region that is under test or that is known to include errors.

In one embodiment, according to micro-retirement, when the logging module 1106 has identified a storage region in error, the storage region testing module 1108 may test additional storage regions to determine the extent of the errors in the memory device 902. As data errors may be localized in certain areas of the memory device 902, the storage region testing module 1108 may test additional storage regions adjacent to those in error. One of skill in the art will recognize the variety of ways in which the storage region testing module 1108 may test additional storage regions.

In one embodiment, the apparatus 1100 includes an area reconfiguration module 1110 that replaces data in the one or more storage regions in the selected memory device 902 with replacement data from one or more extra memory devices 904 for future operations such that data outside the one or more storage regions in the selected memory device 902 is not replaced. For example, according to micro-retirement, only those storage regions in error may be initially retired. Therefore, the area reconfiguration module 1110 may replace data in the storage regions in error without replacing data in the rest of the memory device 902. In this manner, an entire memory device 902 is spared retirement in the absence of further testing.

In certain embodiments, the area reconfiguration module 1110 may use the same extra memory devices 904 to replace data on several storage regions. The area reconfiguration module 1110 replaces data from the storage regions on a selected memory device 902 with replacement data from extra memory devices 904 and replaces data from additional storage regions from the same extra memory devices 904 if the storage regions and the additional storage regions do not share a common logical page 416. The additional storage regions may reside on the same selected memory device 902 or a different selected memory device 902.

For example, the apparatus 1100 may determine that area X is in error in the first memory device 902*a* and area Y is in error in the second memory device 902*b*, area Z is in error in the third memory device 902*c*, etc. As long as the areas (X, Y, Z, etc.) do not overlap memory addresses (e.g. addresses in area X are not in common with memory addresses in areas Y, Z, etc.), the area reconfiguration module 1110 may replace data from area X of the first memory device 902*a* with corrected data, data from area Y of the second memory device 902*b* with corrected data, and area Z of the third memory device 902*c* with corrected data from the same extra memory device 904.

If the storage regions and the additional storage regions share a common logical page 416 or common memory addresses, the area reconfiguration module 1110 may replace data from the one or more storage regions with replacement data from the extra memory devices 904 and replace data in the additional storage regions from one or more different extra memory devices 904.

In one embodiment, the apparatus 1100 includes an analysis module 1112 that analyzes the log to determine an area in the selected memory device 902 with data errors. The size of the areas in the memory devices 902*a-n* in error may be individually determined by analysis of logged errors. In addition, the analysis module 1112 may also determine an error type with more detail on the failure. For example, an uncorrectable error may be detected and further analysis may indicate that an error is due to an erase failure, a program failure, a read failure, a diagnostic failure, a POST failure, and the log.

In one embodiment, the apparatus 1100 includes an error storage recovery module 1114 that erases an erase block with the one or more errors to prepare the erase block for future data storage in response to a selected memory device 902 in error. In flash memory, program disturbs (write disturbs) and read disturbs can cause temporary errors. For a particular memory location, when data around the memory location is programmed or read, the proximity of the data lines other programmed/read locations can disturb the data in the memory location. This error can be a temporary error solved by refreshing the memory location during a garbage collection (storage space recovery) operation.

In the garbage collection operation typically valid data is moved from an erase block or other area of memory to another location and the erase block is erased. For flash memory, this may involve writing a "1" to all memory cells in the erase block, which charges the cells. The erase block can then be re-used and new data can be stored in the erase block. The apparatus 1100 may then continue to log errors and if the memory location in error prior to the garbage collection operation is in error again, the memory location may be retired and marked as permanently unusable and data corresponding to the memory location in the extra memory device(s) 904 can be substituted for the failed memory location.

In one embodiment, the apparatus 1100 includes a correct data module 1116 that returns corrected data in response to a selected memory device 902 in error. In one embodiment, the corrected data is the replacement data combined with the available data by the isolation module 1006 when the isolation module 1006 has identified a selected memory device 902 in error. As stated above, a selected memory device 902 in error is identified when the available data combined with the replacement data contains either no errors or errors such that the errors are correctable using the ECC.

In one embodiment, the apparatus 1100 includes a reporting module 1118 that reports the error in response to a selected memory device 902 in error. The reporting module 1118 may report errors to alert a user to a potential memory device 902 failure or to aid in error diagnosis. Furthermore, the reporting module 1118 may also report potential memory devices 902 or storage regions for that a user may select for retirement.

Figure 12:
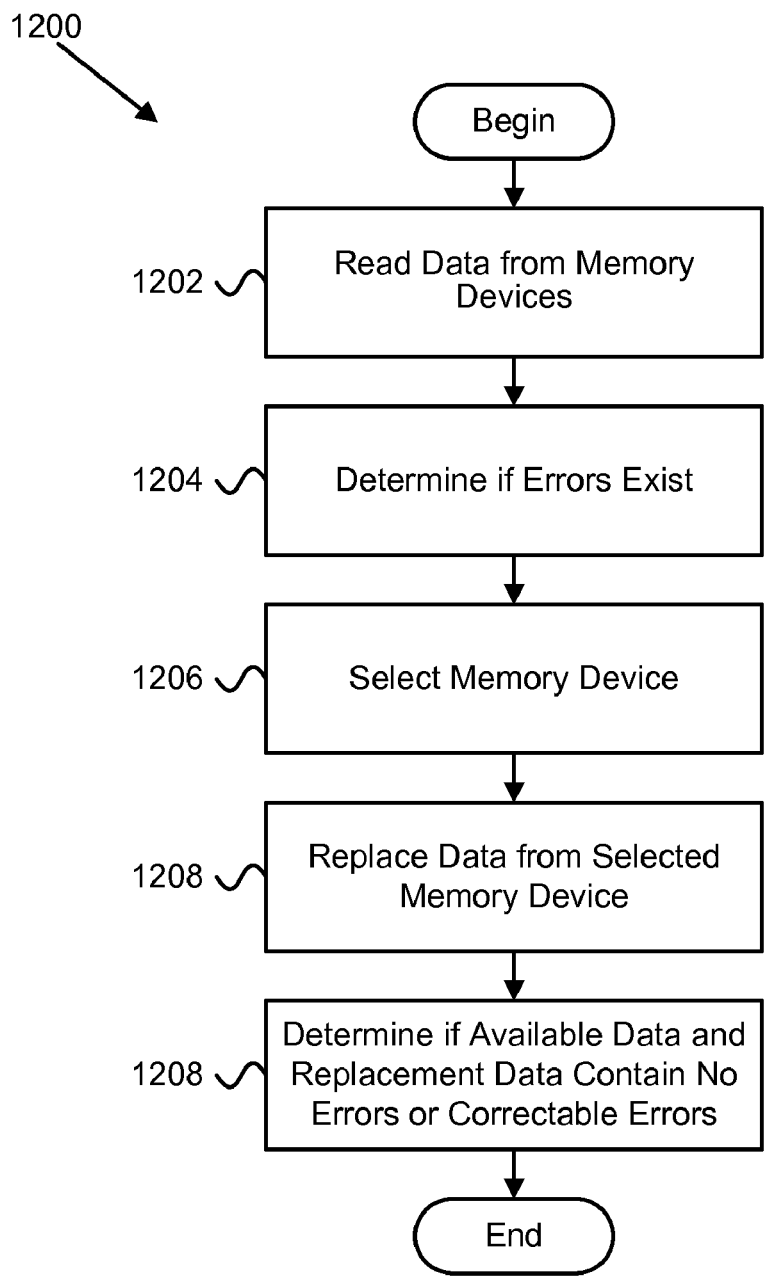
FIG. 12 is a schematic flow chart diagram illustrating one embodiment of a method for detecting and replacing failed data storage in accordance with the present invention.

FIG. 12 is a schematic flow chart diagram illustrating one embodiment of a method 1200 for detecting and replacing failed data storage in accordance with the present invention. The method 1200 begins and the read module 1002 reads 1202 data from an array of memory devices with two or more memory devices 902 and one or more extra memory devices 904 storing parity information from the memory devices 902.

The ECC module 1004 determines 1204 if one or more errors exist in tested data and if the errors are correctable using the ECC. The tested data includes data read by the read module 1002. The ECC may be stored in an ECC chunk 418 along with the data read by the read module 1002. In response to the ECC module 1004 determining that errors exists in the data read by the read module 1002 and that the errors are uncorrectable using the ECC, the isolation module 1006 selects 1206 a memory device 902 from the array of memory devices.

The isolation module 1006 replaces 1208 data read from the selected memory device 902 with replacement data, or data generated from the parity data stored on the one or more extra memory devices 904. The isolation module 1006 combines replacement data with available data or data read from the memory devices 902 that are not selected. The ECC module 1004 determines 1208, for the selected memory device 902, if the available data combined with the replacement data contains either no errors or errors such that the errors are correctable using the ECC, and the method 1200 ends.

Figure 13:
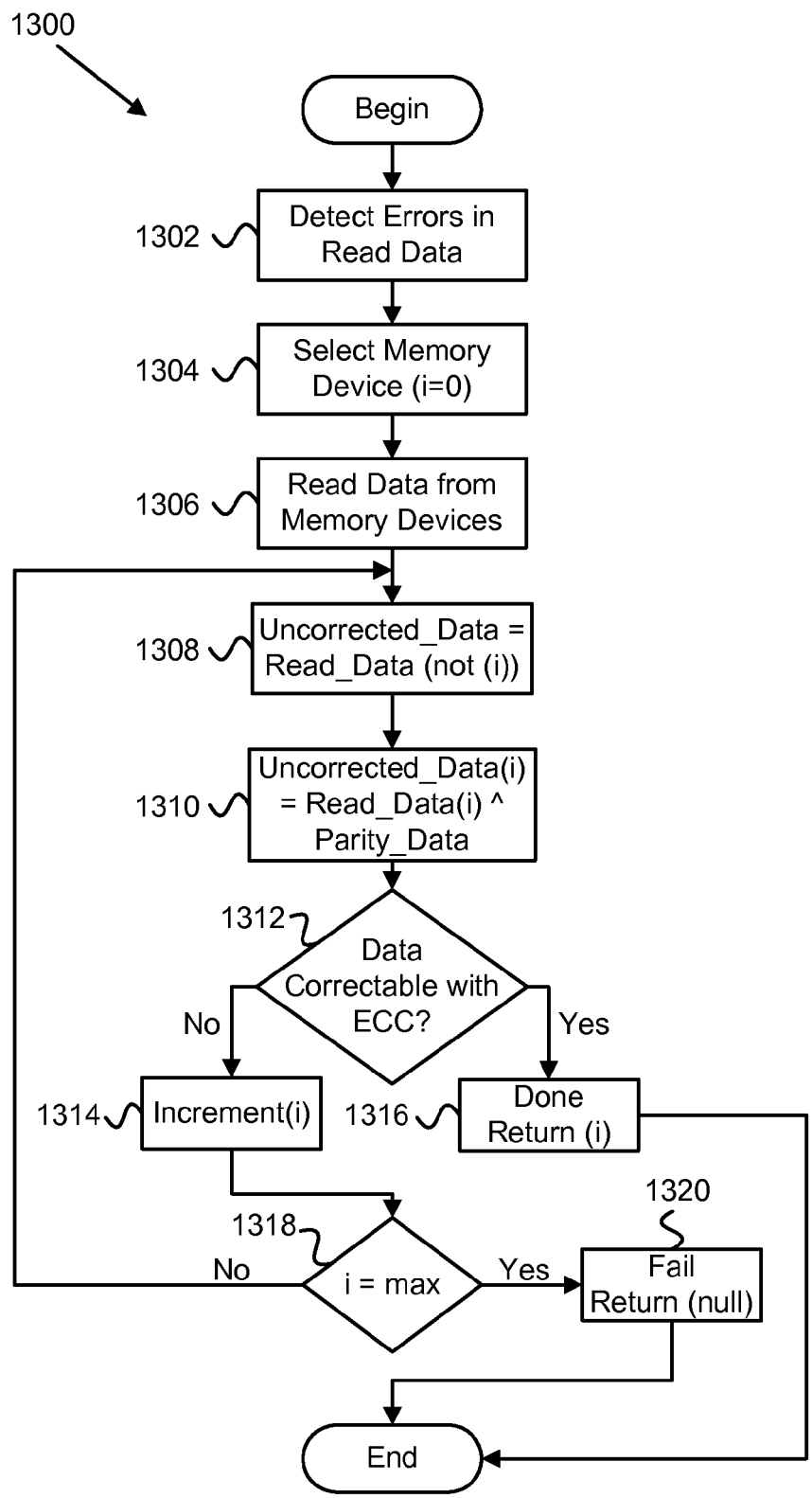
FIG. 13 is a schematic flow chart diagram illustrating another embodiment of a method for detecting and replacing failed data storage in accordance with the present invention.

FIG. 13 is a schematic flow chart diagram illustrating one embodiment of a method 300 for detecting and replacing failed data storage in accordance with the present invention. The method 1300 illustrates the isolation module 1006 iterating through each memory device 902. The method 1300 begins and the ECC module 1004 detects 1302 errors in read data. The method 1300 then selects 1304 a memory device 902a and iterates to determine which memory device 902 is bad. In this example, a variable is set to zero (i=0). The read module 1002 then reads 1306 data from the memory devices 902 except that the memory device 902 being tested has MUX 912 selected to read data from the data recovery 906. For the memory devices 902 not selected, the uncorrected data is read 1308. For the first pass through the method 1300, i=0 and the first memory device 902a is selected 1304. For the selected memory device 902a, the uncorrected data becomes 1310 the read data (e.g. A) XORed with the output of the data recovery 906 (e.g. C'C). The ECC module 1004 then determines 1312 if the data is correctable.

If it is correctable, the isolation module 1006 returns 1316 the selected device (i) and the method 1300 is completed. If the ECC module 1004 determines 1312 that the data is still uncorrectable, the isolation module 1006 increments 1314 the variable i. The isolation module 1006 then determines 1318 if the variable i is at a maximum value, indicating that all memory devices 902 have been tested. If the isolation module 1006 determines 1318 that the variable i is at a maximum value, the isolation module 1006 returns 1320 a message of failure indicating more than one memory device 902 in error or some other error that is not correctable by the apparatus 900.

If the isolation module 1006 determines 1318 that the variable i is not at a maximum value, the isolation module 1006 returns and tests the next memory device 902. The method 1300 continues until the apparatus 900 determines 1312 that the error is correctable or all memory devices 902 have been tested and the apparatus 900 returns 1320 a failure.

The method 1300 is merely one embodiment of the present invention and one of skill in the art will recognize other ways to selectively test memory devices 902 to replace data of a memory device 902 with data from an extra memory device 904.

Figure 14:
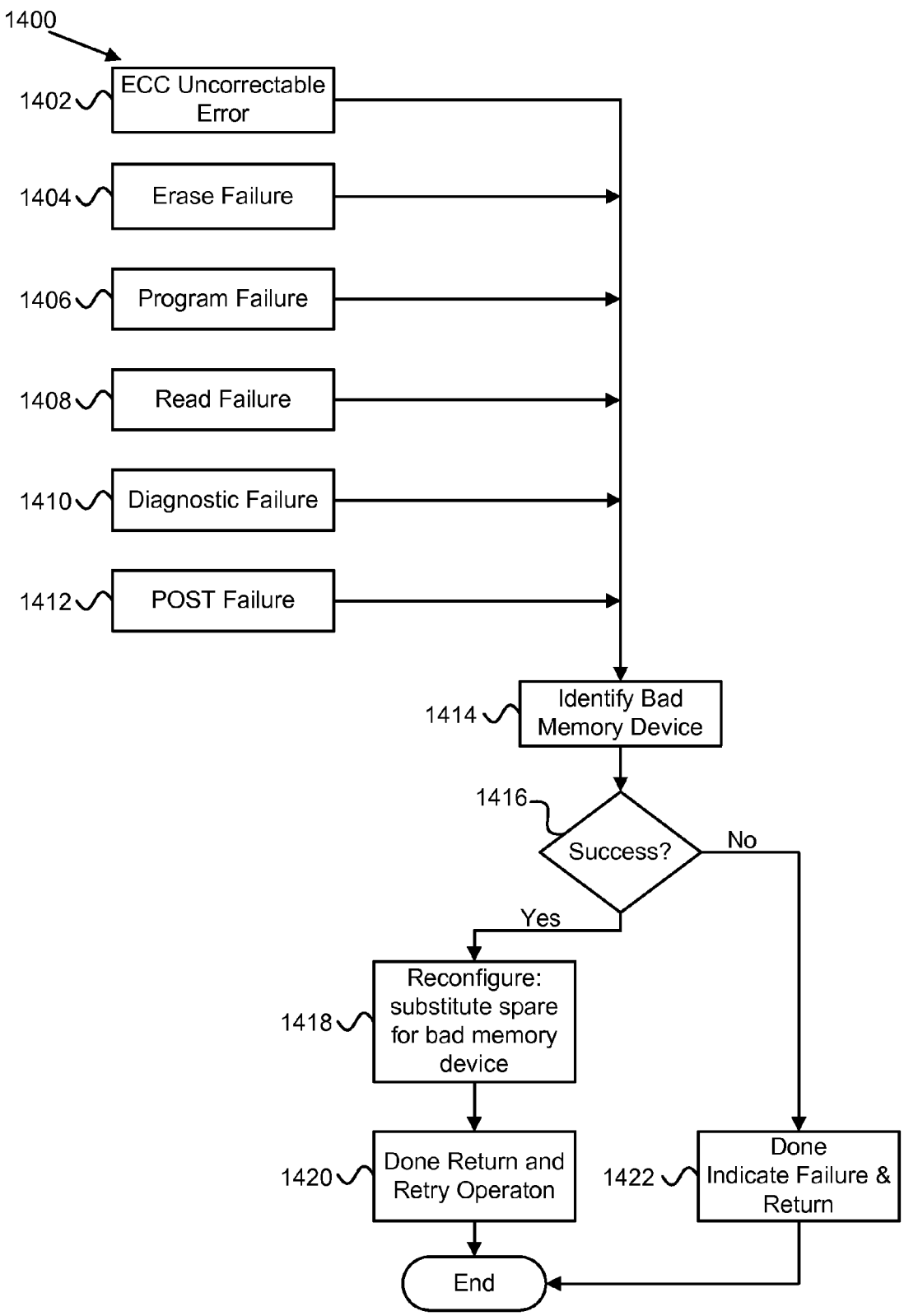
FIG. 14 is a schematic flow chart diagram illustrating another embodiment of a method for detecting and replacing failed data storage in accordance with the present invention.

FIG. 14 is a schematic flow chart diagram illustrating another embodiment of a method 1400 for detecting and replacing failed data storage in accordance with the present invention. The method 1400 pertains to analyzing errors to determine how to segment or partition the memory devices 902,904 to correct errors. The method 1300 of FIG. 13 first executes and the apparatus 1000 isolates the error and returns which memory device 902 is in error and memory location information. The method 1400 begins and error data logged by the logging module 1106 is analyzed by the analysis module 1112 to determine what type of error occurred. For example, another ECC uncorrectable error may be detected 1402 and further analysis may indicate that an error is due to an erase failure 1404, a program failure 1406, a read failure 1408, a diagnostic failure 1410, a POST failure 1412, etc. The logged error data may be used to isolate the error to a particular area within a memory device 902.

Based on the analysis, the method 1400 identifies 1414 the particular bad memory device 902 as a minimum, but analysis may also be able to isolate a particular area within the memory device 902 that is bad. The method 1400 determines 1416 if the bad memory device 902 has been isolated. If so, the memory device reconfiguration module 1104 reconfigures 1418 the apparatus 900, 950 to substitute data from the extra memory device 904 for the bad memory device 902 and the method 1400 may retry 1420 an operation when the error was first detected. If not, the method 1400 returns 1422 a failure message.

Figure 15A:
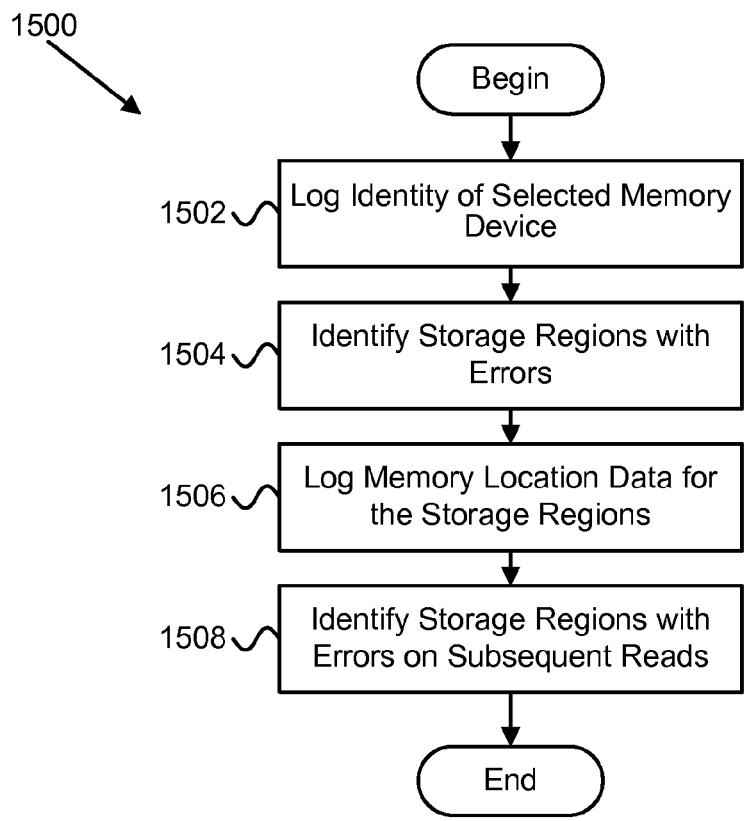
FIG. 15A is a schematic flow chart diagram illustrating one embodiment of a method for logging storage regions with errors in accordance with the present invention.

FIG. 15A is a schematic flow chart diagram illustrating one embodiment of a method 1500 for logging storage regions with errors in accordance with the present invention. The method 1500 is one embodiment according to macro-retirement and occurs after errors are detected on a selected memory device 902. The method 1500 begins and the logging module 1106 logs 1502 an identity of the selected memory device 902. In another embodiment, the logging module 1106 logs an initial area that includes a superset of the area on the memory device 902 with errors.

The storage region testing module 1108 identifies 1504 storage regions comprising errors within the selected memory device 902. In another embodiment, the storage region testing module 1108 identifies storage regions comprising errors within the initial area that is the superset of the area with errors.

The logging module 1106 logs 1506 memory location data for the one or more storage regions identified by the storage region testing module 1108. Furthermore, the storage region testing module 1108 identifies 1508 storage regions with one or more errors with subsequent reads by the read module 1002 and using the ECC module 1004 and the isolation module 1006 to determine storage regions with uncorrectable errors as described above and the method 1500 ends.

The storage region testing module 1108 may continuously test storage regions within the memory device 902 as a whole or larger storage region to isolate errors. In this manner, the area under test is repeatedly focused in a top-down approach. Furthermore, the retirement module 1102 may retire the memory device 902 from standard operations while the method 1500 is performed according to the retirement policy.

Figure 15B:
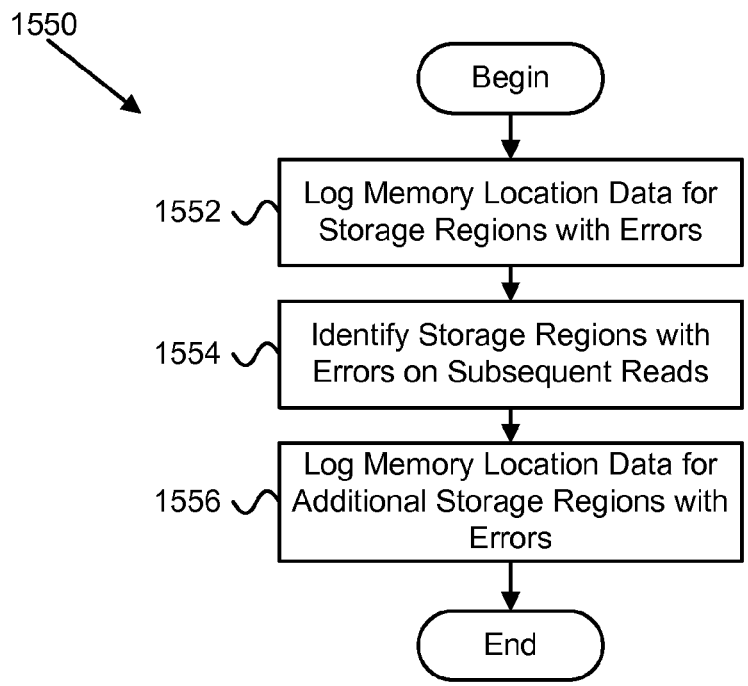
FIG. 15B is a schematic flow chart diagram illustrating another embodiment of a method for logging storage regions with errors in accordance with the present invention.

FIG. 15B is a schematic flow chart diagram illustrating another embodiment of a method 1550 for logging storage regions with errors in accordance with the present invention. The method 1550 is one embodiment according to micro-retirement and occurs after errors are detected on a selected memory device 902. The method 1550 begins and the logging module 1106 logs 1552 one or more storage regions comprising one or more errors. The ECC module 1004 and the isolation module 1006 identify 1554 additional storage regions with errors with subsequent reads as described above. The subsequent read may include a read initiated by a storage region testing module 1108 to target specific storage regions, such as adjacent storage regions, to enlarge the storage region known to include errors. The subsequent read may also be a standard read from a read request, if, for example, the retirement module 1102 did not retire the storage region from standard operations.

The logging module 1106 logs 1556 memory location data specifying these one or more additional storage regions with errors and the method 1550 ends. The storage region testing module 1108 may continuously test storage regions to expand the storage region or storage regions under test. In this manner, the area under test or known to include errors is repeatedly enlarged to locate additional errors in a bottom-up approach. Furthermore, the retirement module 1102 may retire the storage regions from standard operations while the method 1550 is performed according to the retirement policy.

Figure 16:
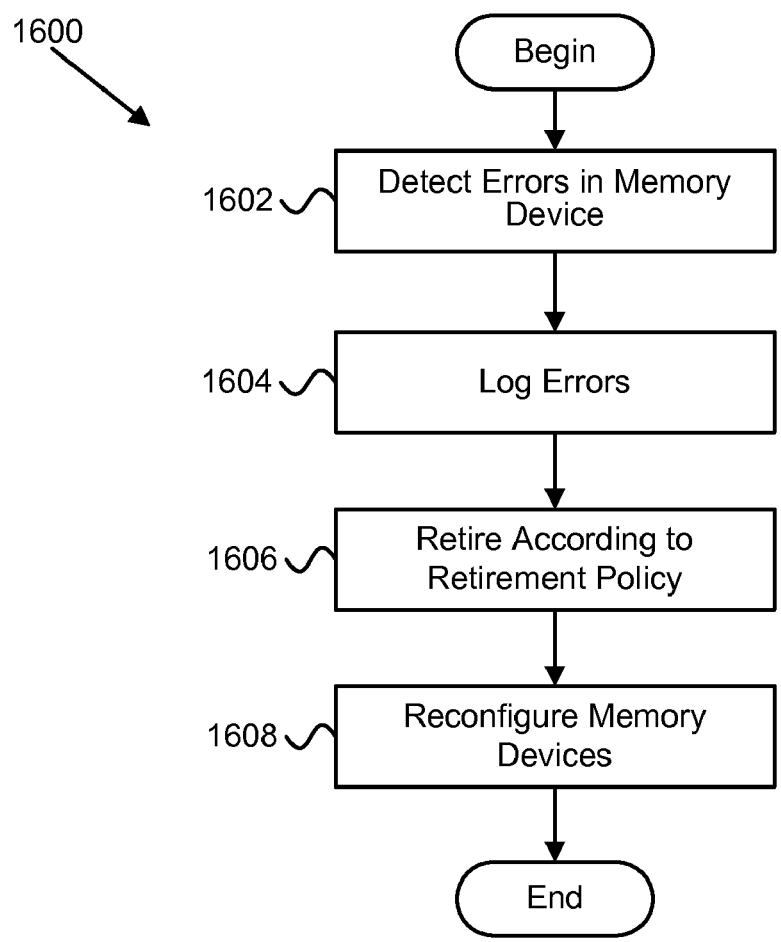
FIG. 16 is a schematic flow chart diagram illustrating one embodiment of a method for retiring an erase block in accordance with the present invention.

FIG. 16 is a schematic flow chart diagram illustrating one embodiment of a method 1600 for retiring an erase block in accordance with the present invention. The method 1600 begins and the ECC module 1004 and the isolation module 1006 detect 1602 errors in a memory device 902 as described above. The logging module 1106 logs 1604 the errors according to the retirement policy as described in above. The retirement module 1102 retires 1606 the memory device 902, or storage regions within the memory device 902 according to the retirement policy. As described below, the reconfiguration apparatus 120 may then reconfigure 1608 the memory devices 902 to write the data to areas not in error and the method 1600 ends.

Reconfiguring Storage Elements

Figure 17:
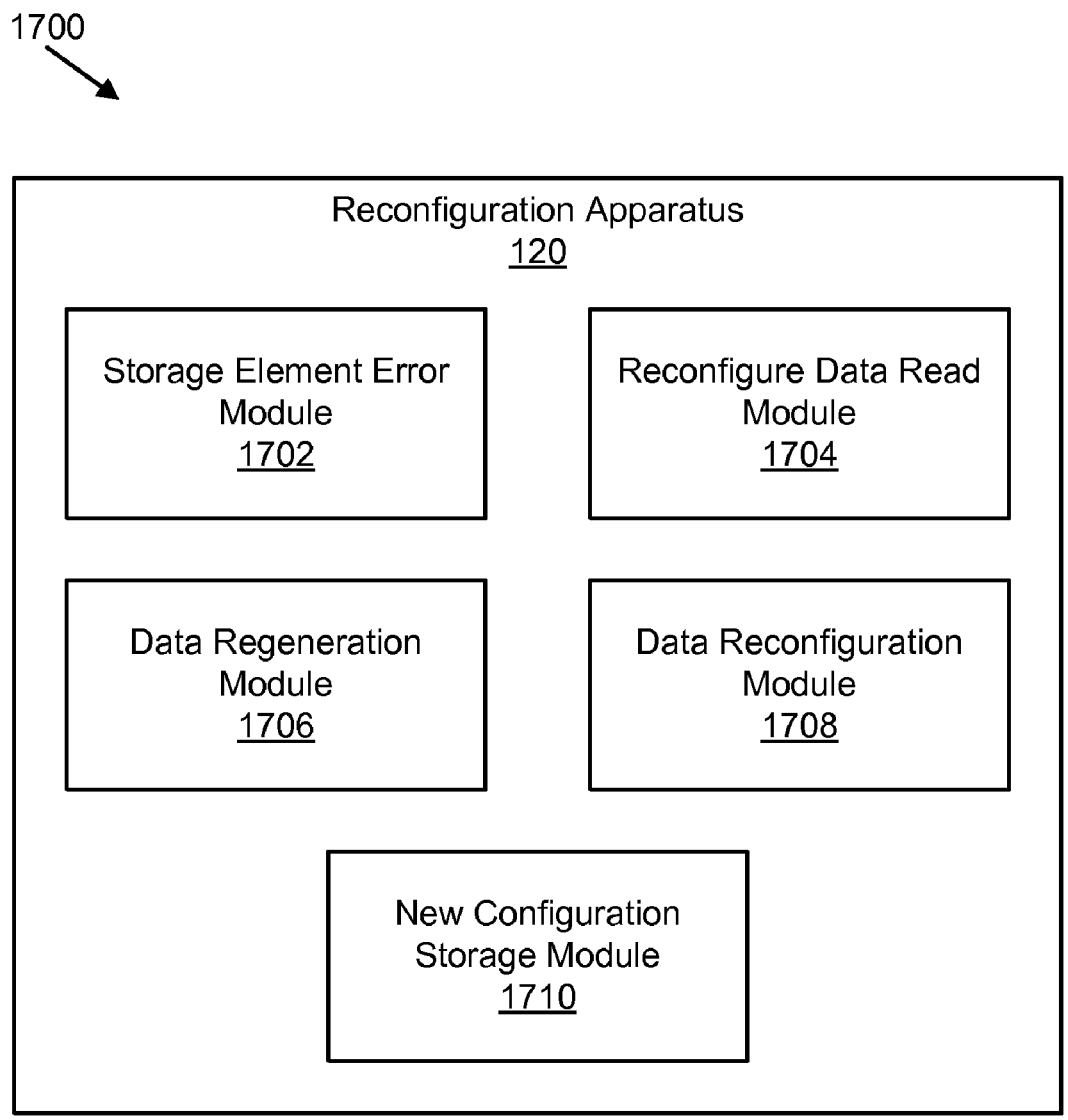
FIG. 17 is a schematic block diagram illustrating one embodiment of an apparatus to reconfigure an array of solid-state storage elements protected using parity data in accordance with the present invention.

FIG. 17 is a schematic block diagram illustrating one embodiment of an apparatus 1700 to reconfigure an array of solid-state storage elements 402 protected using parity data in accordance with the present invention. The apparatus 1700 includes one embodiment of the reconfiguration apparatus 120 and includes, in one embodiment, a storage element error module 1702, a reconfigure data read module 1704, a data regeneration module 1706, a data reconfiguration module 1708, and a new configuration storage module 1710, which are described below.

In one embodiment, the apparatus 1700 includes a storage element error module 1702 that determines that one or more storage elements 402 are unavailable to store data ("unavailable storage elements"). The storage element 402 may reside in an array of three or more storage elements 402. Furthermore, each storage element 402 in the array may include non-volatile solid-state storage 110. Similar to the array of storage elements 400 described above, data is written to a logical page 416 of the array 400 that includes a page on each of the storage elements 402 in the array 400. Note that an unavailable storage element 402 may only have a region of the storage element 402, such as a page, erase block, etc., that is unavailable such that the storage element 402 is available for regions other than the region that is unavailable. It is beneficial to keep as much capacity as possible in service to improve performance and extend the useful life of the storage element 402.

The array 400 may include N number of storage elements 402 storing a first ECC chunk 418 and P number of storage elements 402 storing first parity data generated from the first ECC chunk 418. The N number of storage elements 402 may store a plurality of ECC chunks 418 and the P number of storage elements 402 may store parity data generated from the plurality of ECC chunks 418. A portion of the first ECC chunk 418 is stored on each of N number of storage elements 402. The ECC chunk 418 includes data ("stored data") and ECC generated from the stored data, a portion of the first ECC chunk 418 is stored on each of N number of storage elements 402. In one embodiment, each of the storage elements 402 of the array 400 include one or more append points and data is stored on the array of storage elements 400 sequentially.

The data is stored sequentially such that data is written to an append point. Sequential storage differs from random access storage in that in a read-modify-write operation, the data is read from one location, modified, and then written at an append point where data is currently written. Once the data is written, the append point moves to the end of the newly written data and is ready for the next data to be written to the new append point.

In one embodiment, an unavailable storage element 402 is a storage element 402 with errors or a storage element 402 identified or retired by the detection apparatus 118 as described above. In certain embodiments, the storage element error module 1702 determines that a storage element 402 is in error or is unavailable by determining that errors in the first ECC chunk 418 are uncorrectable using the ECC stored with the first ECC chunk 418. The storage element error module 1702 may determine that a storage element 402 is in error using a plurality of ECC chunks 418. Errors that are uncorrectable using ECC may be indicative of a problem with the storage element 402 beyond read or write disturbs. In addition, a user may specify an unavailable storage element 402.

In one embodiment, the storage element error module 1702 determines that a storage element 402 is in error by determining that a storage element 402 that is functioning ("failing storage element") has reached a replacement threshold. For example, a storage element 402 may still function, but may be failing, degrading in performance, or destined to fail. The replacement threshold may be an indicator of the health of the storage element 402. The replacement threshold may include a rate of errors in data stored on the failing storage element 402, a number of errors in data stored on the failing storage element 402, a number of read and/or write operations on the failing storage element 402, an environmental condition in the failing storage element 402, and the like.

After the storage element error module 1702 determines one or more unavailable storage elements 402, the storage element error module 1702 may determine one or more additional unavailable storage elements 402 as is described in greater detail below.

In one embodiment, the apparatus 1700 includes a reconfigure data read module 1704 that reads data from storage elements 402 other than the unavailable storage elements 402 ("available data"). The available data, in one embodiment, includes data from a logical page 416. The reconfigure data read module 1704 reads the available data and not data from the failing storage element so that data is obtained that has no errors or has a number of errors that are correctable using the ECC stored with the data. Typically the available data has a lower chance of containing errors than if data is used from the failing storage element. Furthermore, if the unavailable storage element 402 is non-functional, the unavailable storage element 402 may not even be accessed by the reconfigure data read module 1704.

In one embodiment, the reconfigure data read module 1704 operates in a background process such as a storage space recovery operation. One example of a storage space recovery operation includes a garbage collection process. By operating in a background process, the reconfigure data read module 1704 may minimize interference with the operation of the solid-state storage device 102.

In one embodiment, the apparatus 1700 includes a data regeneration module 1706. In response to the available data including first parity data, the data regeneration module 1706 uses the first parity data to regenerate missing data from the first ECC chunk 418 ("missing data"). In another embodiment, in response to the available data including the ECC chunk 418, the data regeneration module 1706 regenerates the first parity data. The first parity data may include simple XOR parity information or may be more complex involving a plurality of storage elements 402 storing parity data. The first parity data may be provided by the detection apparatus 118. Likewise, the data regeneration module 1706 may regenerate the missing data using an XOR operation, as depicted in FIGS. 9A & 9B, or other similar parity operation known in the art. The data regeneration module 1706 may regenerate missing data for a plurality of ECC chunks 418 using parity data for the ECC chunks 418. In one embodiment, the data regeneration module 1706 operates in a background process such as a storage space recovery operation.

In one embodiment, the apparatus 1700 includes a data reconfiguration module 1708 that generates second ECC from one or more of the available data, the missing data, and data received by a storage controller ("new data"). The second ECC together with data used to create the second ECC form a second ECC chunk 418. Furthermore, the data reconfiguration module 1708 may also generate second parity data from the second ECC chunk 418 to protect the data in the second ECC chunk 418.

In one embodiment, the data reconfiguration module 1708 keeps new data separate from the first ECC chunk 418 so that the first ECC is identical to the second ECC and the first ECC chunk 418 is identical to the second ECC chunk 418. In another embodiment, new data is mixed with data from the first ECC chunk 418 so that the data reconfiguration module 1708 generates a second ECC for the new data and a portion of data from the first ECC chunk 418. In one embodiment, the data reconfiguration module 1708 operates in a background process such as a storage space recovery operation (garbage collection).

In one embodiment, the apparatus 1700 includes a new configuration storage module 1710 that stores at least a portion of the second ECC chunk 418 and associated second parity data on (N+P)−Z number of storage elements 402, wherein $1 \leq Z \leq P$. Therefore, the second ECC chunk 418 and any additional reconfigured ECC chunks 418 are reconfigured to be stored in an array with a lower number of storage elements 402. Z is the number of unavailable storage elements 402.

In a simple case, Z=1 such that the new configuration storage module 1710 stores the second ECC chunk 418 in one less device than the first ECC chunk 418 was stored. Each time a storage element 402 or region of a storage element 402 becomes unavailable, the reconfiguration apparatus 120 reconfigures data stored in the array 400 of storage devices 402 such that the new configuration storage module 1710 stores data on one less storage element 402, at least for a region being retired. In one embodiment, for certain storage regions, ECC chunks 418 are stored on N+P storage elements 402, in other storage regions other ECC chunks 418 are stored on (N+P)−1 storage regions, in other storage regions other ECC chunks 418 are stored on (N+P)−2 storage regions, etc.

In one embodiment, each of the storage elements 402 of the array 400 includes one or more append points and data is stored on the array of storage elements 400 sequentially. In this embodiment, the new configuration storage module 1710 stores the second ECC chunk 418 and associated parity data at an append point on each of the (N+P)−Z storage elements 402. Each append point is moved to the end of data stored just prior to movement of the append point.

When the new configuration storage module 1710 stores the second ECC chunk 418 and second parity data, the data can be reconfigured either with one less parity device or one less data device. For example, if the first ECC chunk 418 was stored on N storage elements 402 and was protected with parity data on two or more storage elements 402 (i.e. P≥2), then the new configuration storage module 1710 can generate the second ECC chunk 418 and second parity data so that the second ECC chunk 418 is still stored on N storage elements 402 but the parity information is stored on P−1 storage elements 402. In this instance, performance of the array 400 will not be affected but the data will have one less layer of parity protection and can tolerate one less storage element 402 failure.

In the case where P=1 or if the parity protection is to remain unchanged, then the new configuration storage module 1710 can generate the second ECC chunk 418 and second parity data so that the second ECC chunk 418 can be stored on N−1 storage elements 402 and the parity information can be stored on P storage elements 402. In this case, performance of the array 400 will be diminished since there are less storage elements 402 that are storing data, however, the parity protection will remain unchanged.

The unavailable storage element 402 may be either a storage element 402 storing data or a storage element 402 storing parity data, depending upon location of the logical page 416 being accessed and rotation of parity data. However, the nature of the data stored on the unavailable storage element 402 need not have any connection to the configuration of the data stored by the new configuration storage module 1710. Therefore, if the unavailable storage element 402 stores parity data, the new configuration storage module 1710 in one embodiment may store a portion of the second ECC chunk 418 on (N–Z) storage elements 402 and the associated second parity data on P storage elements 402, or in another embodiment, the new configuration storage module 1710 may store a portion of the second ECC chunk 418 on N storage elements 402 and the associated second parity data on P–Z storage elements 402 where P>1.

In one embodiment, the new configuration storage module 1710 stores a portion of the second ECC chunk 418 on what was formerly a storage element 402 storing parity data. Likewise, in another embodiment, the new configuration storage module 1710 stores parity data associated with the second ECC chunk 418 on what was formerly a storage element 402 storing data from the ECC chunk 418. Once a storage region, such as a logical erase block 414, has been erased and is ready to again store data, the reconfiguration apparatus 120 can store data and parity data in any convenient combination. In a preferred embodiment, the second ECC chunk 418 is stored in a different logical erase block 414 than the logical erase block 414 that was read to obtain the first ECC chunk 418. The reconfiguration of the storage may reconfigure the logical erase block 414 and the way the ECC chunk 418 is stored within the logical erase block 414. This may change the number of bytes from within the ECC chunk 418 that are stored on the storage element 402. In another reconfiguration, the size of the ECC chunk 418 may be modified to maintain the same number of bytes stored by the ECC chunk 418 on the storage element 402.

A redundant storage system such as a RAID system provides data protection in the event that a certain number of data or parity storage elements 402 fail. The array 400 is protected in a RAID-like fashion because data is striped similar to RAID and protected with parity data. If these storage elements 402 are not replaced, and the number of defective or unavailable storage elements 402 falls below the certain number of failed storage elements 402 that the RAID system accommodates, data will be lost. However, by reconfiguring the data from the N+P array of storage elements 400 to the (N+P)–Z array of storage elements 400, the array 400 may retain a level of data protection even when storage elements 402 are not replaced. Beneficially, unlike a conventional RAID configuration, a failed storage element 402 is not required to be replaced. By reconfiguring the RAIDed data, the remaining functional storage elements 402 may be reconfigured to accommodate the failed storage element 402.

In the event that a macro-retirement methodology is utilized as described above, it may be necessary to reverse the reconfiguration to return from the (N+P)–1 to the (N+P) state. This process is essentially the same as described above and one skilled in the art recognizes that the second ECC chunk 418 may be further reconfigured to be stored on the N+P number of storage elements 402.

Furthermore, the apparatus 1700 may continue to reconfigure ECC chunks 418 if more storage elements 402 fail or become unavailable. After the storage element error module 1702 identifies one or more unavailable storage elements 402 and the reconfigure data read module 1704, the data regeneration module 1706, the data reconfiguration module 1708, and the new configuration storage module 1710 act to store one or more ECC chunks 418 on (N+P)–Z storage elements 402, the storage element error module 1702 may identify more unavailable storage elements 402. Consequently, the reconfigure data read module 1704, the data regeneration module 1706, the data reconfiguration module 1708, and the new configuration storage module 1710 act to store one or more additional ECC chunks 418 on ((N+P)–Z)–Y storage elements 402. Y may be the number of unavailable storage elements 402 determined after the last reconfiguration.

Figure 18:
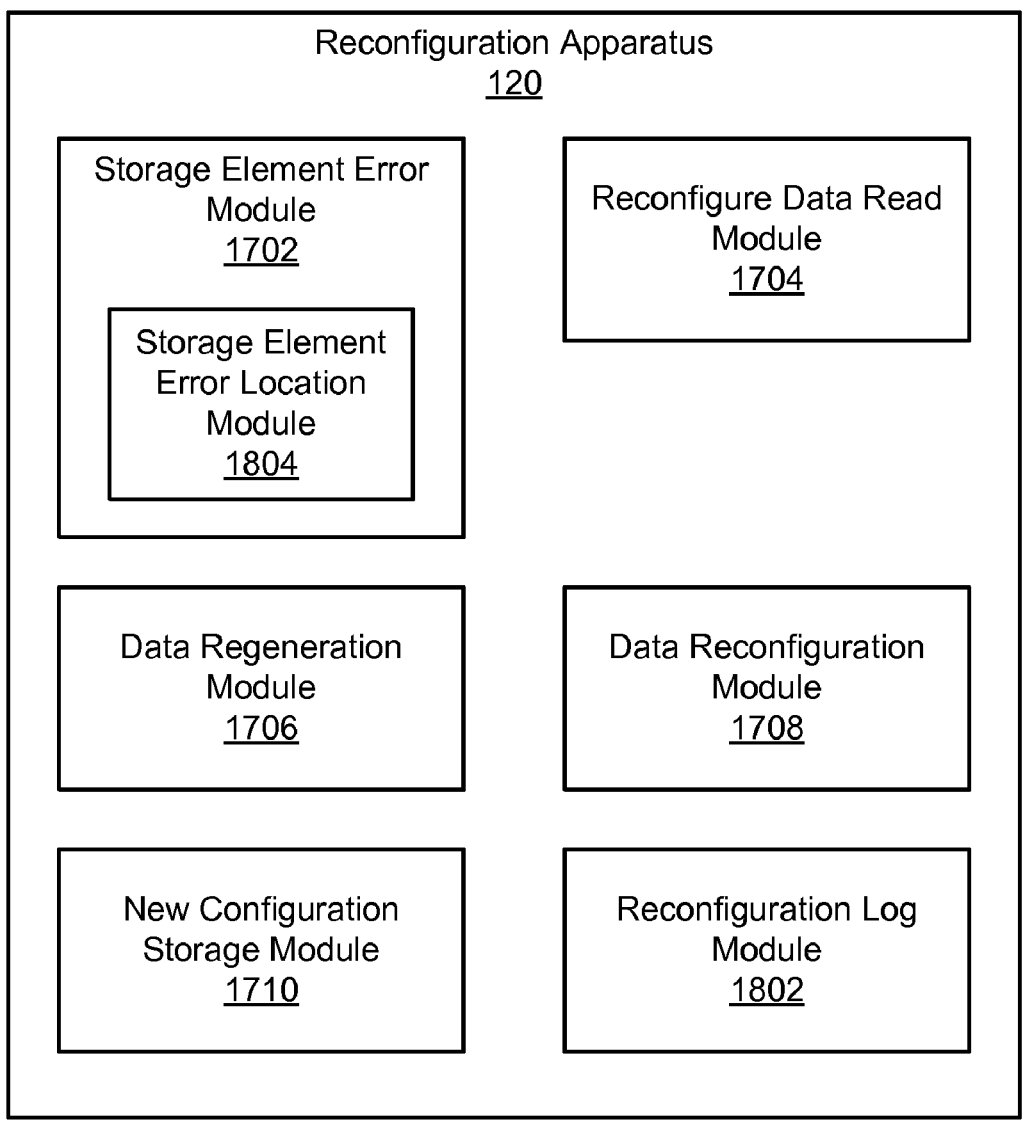
FIG. 18 is a schematic block diagram illustrating another embodiment of an apparatus to reconfigure an array of solid-state storage elements protected using parity data in accordance with the present invention.

FIG. 18 is a schematic block diagram illustrating another embodiment of an apparatus 1800 to reconfigure an array of solid-state storage elements 402 protected using parity data in accordance with the present invention. The apparatus 1800 includes a storage element error module 1702, a reconfigure data read module 1704, a data regeneration module 1706, a data reconfiguration module 1708, and a new configuration storage module 1710, which are substantially similar to those described with respect to the apparatus 1700 in FIG. 17. The apparatus 1800, in various embodiments, may also include a reconfiguration log module 1802 and a storage element error location module 1804, which are described below.

In one embodiment, the apparatus 1800 includes a reconfiguration log module 1802 that identifies one or more regions in the array of storage elements 400 where data is stored in (N+P)–Z storage elements 402. The reconfiguration log module 1802 may identify a region by logging data regarding the region in a log file, such as location of the region, timestamp or sequence information regarding when reconfigured data was first stored in the region, etc. The one or more regions may include physical or logical areas on the storage element 402 or multiple storage elements 402. A region may include a portion of a logical page 416, a logical page 416, a group of logical pages 416, a portion of an erase block, an erase block, a group of erase blocks, one or more dies, or one or more chips. In one embodiment, the reconfiguration log module 1802 identifies the regions in the log with a logical-to-physical map. The log file may be used during a read operation, programming operation, etc. so that the storage controller 104 knows which storage elements 402 to access.

In one embodiment, the reconfiguration log module 1802 tracks a storage region that is unavailable for data storage on the unavailable storage element 402. If portions of a storage element 402 are not unavailable and are functioning, data may still be stored on the available portions. Therefore, the reconfiguration log module 1802 tracks the unavailable storage regions such that data is stored on (N+P)–Z storage elements 402 for the unavailable region and on N+P storage elements 402 for locations outside the unavailable storage region. A storage region includes a portion of each of the N+P storage elements 402 and may include a portion of a logical page 416, a logical page 416, a plurality of logical pages 416, a portion of a logical erase block 414, a logical erase block 414, a plurality of logical erase blocks 414, a die, a plurality of dies, a chip, and/or a plurality of chips. The reconfiguration log module 1802 prevents functioning portions of storage elements 402 from going to waste.

In one embodiment, the reconfiguration log module 1802 tracks unavailable storage regions with varying numbers of storage elements 402. Specifically, the reconfiguration log module 1802 may tracks one or more unavailable storage regions where data is stored in (N+P)–Z storage elements 402 and one or more additional unavailable storage regions where data is stored in ((N+P)–Z)–X storage elements 402. In storage regions other than the unavailable storage regions data is stored in N+P storage elements 402.

Typically, storage regions with more available storage elements 402 have a higher performance than storage regions with less available storage elements 402. In one embodiment, data is stored and segregated in the array of storage elements 400 by performance requirements of the data. In the embodiment, data with a higher performance requirement is given a higher priority to be stored in storage regions with a higher performance. For example, certain data that is accessed frequently may be stored in a storage region with a higher performance. As described above, an array of storage elements 400 with a greater number of N storage elements 402 may have higher performance.

In one embodiment, the storage element error module 1702 determines that a storage element 402 is in error by determining that errors in the first ECC chunk 418 are uncorrectable by using the ECC stored with the first ECC chunk 418. For example, the storage element error module 1702 may use the detection apparatus 118 to determine that errors in the first ECC chunk 418 are uncorrectable. In a further embodiment, the storage element error module 1702 includes a storage element error location module 1804 that uses data stored in one or more of the storage elements 402 storing one or more ECC chunks 418 and the storage elements 402 storing associated parity data to identify the storage element 402 that is unavailable for storing data. The storage element error location module 1804 may include one embodiment of the detection apparatus 118 described above to identify the storage element 402 that is unavailable. In one embodiment, the storage element error location module 1804 uses hardware gates and logic to substitute the data stored in one or more of the storage elements 402 storing one or more ECC chunks 418.

Figure 19:
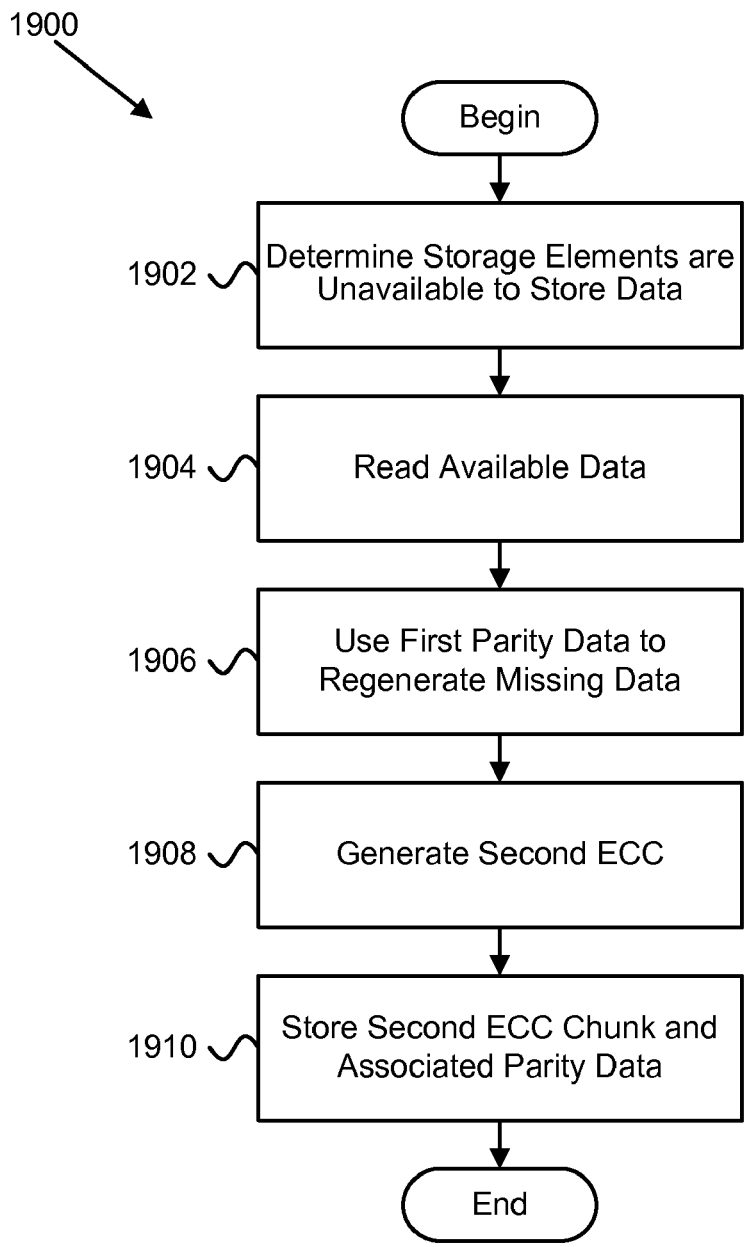
FIG. 19 is a schematic flow chart diagram illustrating one embodiment of a method to reconfigure an array of solid-state storage elements protected using parity data in accordance with the present invention.

FIG. 19 is a schematic flow chart diagram illustrating one embodiment of a method 1900 to reconfigure an array 400 of solid-state storage elements 402 protected using parity data in accordance with the present invention. The method 1900 begins and the storage element error module 1702 determines 1902 that one or more storage elements 402 are unavailable to store data ("unavailable storage elements"). The storage elements 402 are part of an array of three or more storage elements 402 and data is written to a logical page 416 of the array 400. Furthermore, the array 400 includes N number of storage elements 402 storing a first ECC chunk 418 and P number of storage elements 402 storing first parity data generated from the first ECC chunk 418.

The reconfigure data read module 1704 reads data 1904 from storage elements 402 other than the unavailable storage elements 402 ("available data"). The available data includes data from a logical page 416. If the available data includes first parity data, the data regeneration module 1706 uses 1906 the first parity data to regenerate missing data from the first ECC chunk 418 ("missing data").

The data reconfiguration module 1708 generates 1908 second ECC from the available data, the missing data, and/or data received by a storage controller ("new data"). The second ECC and data are used by the data reconfiguration module 1708 to create a second ECC chunk 418. The data reconfiguration module 1708 also generates second parity data from the second ECC chunk 418. In one embodiment, the data reconfiguration module 1708 does not include new data so the second ECC is generated from data of the first ECC chunk 418 and is therefore typically identical to the first ECC. In this case the second ECC chunk 418 is identical to the first ECC chunk 418. In cases where new data is mixed with data of the first ECC chunk 418, the data of the second ECC chunk 418 will differ from data of the first ECC chunk 418 so the second ECC will differ from the first ECC and the second ECC chunk 418 will differ from the first ECC chunk 418.

The new configuration storage module 1710 stores 1910 a portion of the second ECC chunk 418 and associated second parity data on (N+P)−Z number of storage elements 402, where $1 \leq Z \leq P$ and the method 1900 ends. In one embodiment, at least the reconfigure data read module 1704, the data regeneration module 1706, and the data reconfiguration module 1708 may operate in a background process. Furthermore, the background process may operate in conjunction with garbage collection.

Figure 20:
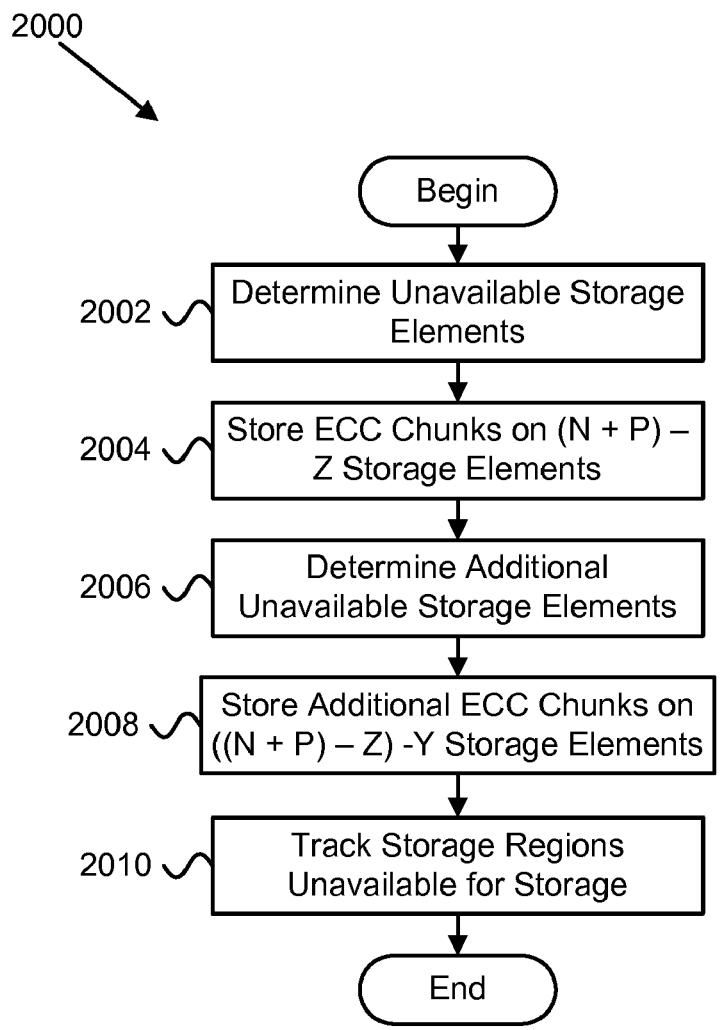
FIG. 20 is a schematic flow chart diagram illustrating one embodiment of a method for determining additional unavailable storage elements in accordance with the present invention.

FIG. 20 is a schematic flow chart diagram illustrating one embodiment of a method 2000 for determining additional unavailable storage elements 402 in accordance with the present invention. The method 2000 begins and the storage element error module 1702 determines 2002 that one or more storage elements 402 are unavailable storage elements 402. The reconfigure data read module 1704, the data regeneration module 1706, the data reconfiguration module 1708, and the new configuration storage module 1710 act to store 2004 one or more ECC chunks 418 on (N+P)−Z storage elements 402 where Z is a number of storage elements 402 found to be unavailable.

The storage element error module 1702 again determines 2006 that one or more additional storage elements 402 are unavailable. The reconfigure data read module 1704, the data regeneration module 1706, the data reconfiguration module 1708, and the new configuration storage module 1710 then act to store 2008 one or more additional ECC chunks 418 on ((N+P)−Z)−Y storage elements 402 where Y is a number of additional storage elements 402 found to be unavailable. The reconfiguration log module 1802 tracks 2010 one or more unavailable storage regions where data is stored in (N+P)−Z storage elements 402 and the one or more additional unavailable storage regions where data is stored in ((N+P)−Z)−Y storage elements 402 and the method 2000 ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to reconfigure an array of solid-state storage elements protected using parity data, the apparatus comprising:
a storage element error module that determines that one or more storage elements are unavailable to store data, the storage element in an array of three or more storage elements, each storage element in the array comprising non-volatile solid-state storage, wherein data is written to a logical page of the array, a logical page of the array comprising a page on each of the storage elements in the array and wherein the array comprises N number of storage elements storing a first ECC chunk and P number of storage elements storing first parity data generated from the first ECC chunk, the ECC chunk comprising data and a first error correcting code ("ECC") generated from the stored data, a portion of the first ECC chunk is stored on each of N number of storage elements;
a reconfigure data read module that reads data from storage elements other than the unavailable storage elements, the available data comprising data from a logical page;
a data regeneration module that, in response to the available data comprising first parity data, uses the first parity data to regenerate missing data from the first ECC chunk;

a data reconfiguration module that generates second ECC from one or more of the available data, the missing data, and data received by a storage controller, the second ECC together with data used to create the second ECC comprise a second ECC chunk, and that generates second parity data from the second ECC chunk, the storage controller controlling data storage on the array of storage elements; and a new configuration storage module that stores a portion of the second ECC chunk and associated second parity data on (N+P)−Z number of storage elements, wherein $1 \leq Z \leq P$, Z comprises a number of unavailable storage elements, and the storage element error module, the reconfigure data read module, the data regeneration module, the data reconfiguration module, and the new configuration storage module comprise one or more of hardware and executable code, the executable code stored on a computer readable storage medium.

2. The apparatus of claim 1, wherein each of the storage elements of the array comprises one or more append points and data is stored on the array of storage elements sequentially and wherein the new configuration storage module stores the second ECC chunk and associated parity data at an append point on each of the (N+P)−Z storage elements, each append point moved to the end of data stored just prior to movement of the append point.

3. The apparatus of claim 1, further comprising a reconfiguration log module that identifies one or more regions in the array of storage elements where data is stored in (N+P)−Z storage elements, a region comprising a portion of each of the N+P storage elements.

4. The apparatus of claim 3, wherein a region comprises one or more of a portion of a logical page, a logical page, a group of logical pages, a portion of an erase block, an erase block, a group of erase blocks, one or more dies, and one or more chips.

5. The apparatus of claim 3, wherein the reconfiguration log module tracks a storage region that is unavailable for data storage such that data is stored on (N+P)−Z storage elements for the unavailable region and on N+P storage elements for locations outside the unavailable storage region, a storage region comprising a portion of each of the N+P storage elements.

6. The apparatus of claim 3, wherein the reconfiguration log module further tracks one or more unavailable storage regions where data is stored in (N+P)−Z storage elements and one or more additional unavailable storage regions where data is stored in ((N+P)−Z)−Y storage elements, wherein in storage regions other than the unavailable storage regions data is stored in N+P storage elements.

7. The apparatus of claim 3, wherein a storage region comprises one or more of a portion of a logical page, a logical page, a plurality of logical pages, a portion of a logical erase block, a logical erase block, a plurality of logical erase blocks, a die, a plurality of dies, a chip, and a plurality of chips.

8. The apparatus of claim 3, wherein storage regions with more available storage elements have a higher performance than storage regions with less available storage elements and wherein data is stored and segregated in the array of storage elements by performance requirements of the data such that data with a higher performance requirement is given a higher priority to be stored in storage regions with a higher performance.

9. The apparatus of claim 1, wherein at least the reconfigure data read module, the data regeneration module, and the data reconfiguration module operate in a background process.

10. The apparatus of claim 9, wherein the background process comprises a storage space recovery operation.

11. The apparatus of claim 1, wherein the storage element error module determines that a storage element is in error by determining that errors in the first ECC chunk are uncorrectable using the ECC stored with the first ECC chunk.

12. The apparatus of claim 11, wherein the storage element error module further comprises a storage element error location module that uses data stored in one or more of the storage elements storing one or more ECC chunks and the storage elements storing associated parity data to identify the one or more storage elements that are unavailable to store data.

13. The apparatus of claim 12, wherein the storage element error location module uses hardware gates and logic to substitute the data stored in one or more of the storage elements storing one or more ECC chunks.

14. The apparatus of claim 1, wherein the storage element error module determines that a failing storage element is in error by determining that the failing storage element that is functioning has reached a replacement threshold.

15. The apparatus of claim 14, wherein the replacement threshold comprises one or more of a rate of errors in data stored on the failing storage element, a number of errors in data stored on the failing storage element, a number of read and/or write operations on the failing storage element, and an environmental condition in the failing storage element.

16. The apparatus of claim 1, wherein the new configuration storage module stores the second ECC chunk on (N−Z) storage elements and the associated second parity data on P storage elements.

17. The apparatus of claim 1, wherein the new configuration storage module stores the second ECC chunk on N storage elements and the associated second parity data on P−Z storage elements where P>1.

18. The apparatus of claim 1, wherein in response to the storage element error module determining that one or more storage elements are unavailable and the reconfigure data read module, the data regeneration module, the data reconfiguration module, and the new configuration storage module acting to store one or more ECC chunks on (N+P)−Z storage elements, the storage element error module determines that one or more additional storage elements are unavailable and the reconfigure data read module, the data regeneration module, the data reconfiguration module, and the new configuration storage module act to store one or more additional ECC chunks on ((N+P)−Z)−Y storage elements.

19. A system to reconfigure an array of solid-state storage elements protected using parity data, the system comprising:

a storage device comprising a storage controller and an array of storage elements controlled by the storage controller, the storage element in an array of three or more storage elements, each storage element in the array comprising non-volatile solid-state storage, wherein data is written to a logical page of the array, a logical page of the array comprising a page on each of the storage elements in the array and wherein the array comprises N number of storage elements storing a first ECC chunk and P number of storage elements storing first parity data generated from the first ECC chunk, the ECC chunk comprising data and a first error correcting code ("ECC") generated from the stored data, a portion of the first ECC chunk is stored on each of N number of storage elements;

a storage element error module that determines that one or more storage elements are unavailable to store data;

a reconfigure data read module that reads data from storage elements other than the unavailable storage elements, the available data comprising data from a logical page;

a data regeneration module that, in response to the available data comprising first parity data, uses the first parity data to regenerate missing data from the first ECC chunk;

a data reconfiguration module that generates second ECC from one or more of the available data, the missing data, and data received by a storage controller, the second ECC together with data used to create the second ECC comprise a second ECC chunk, and that generates second parity data from the second ECC chunk, the storage controller controlling data storage on the array storage elements; and a new configuration storage module that stores a portion of the second ECC chunk and associated second parity data on (N+P)−Z number of storage elements, wherein $1 \leq Z \leq P$ and Z comprises a number of unavailable storage elements.

20. The system of claim 19, further comprising a driver on a server, the server in communication with the storage device over a computer network, the driver interacting with the storage controller to store data on the array of storage elements.

21. A computer readable storage medium storing computer usable program code executable to perform operations for reconfiguring an array of solid-state storage elements protected using parity data, the operations comprising:

determining that one or more storage elements are unavailable to store data, the storage element in an array of three or more storage elements, each storage element in the array comprising non-volatile solid-state storage, wherein data is written to a logical page of the array, a logical page of the array comprising a page on each of the storage elements in the array and wherein the array comprises N number of storage elements storing a first ECC chunk and P number of storage elements storing first parity data generated from the first ECC chunk, the ECC chunk comprising data and a first error correcting code ("ECC") generated from the stored data, a portion of the first ECC chunk is stored on each of N number of storage elements;

reading data from storage elements other than the unavailable storage elements, the available data comprising data from a logical page;

in response to the available data comprising first parity data, using the first parity data to regenerate missing data from the first ECC chunk;

generating second ECC from one or more of the available data, the missing data, and data received by a storage controller, the second ECC together with data used to create the second ECC comprise a second ECC chunk, and that generates second parity data from the second ECC chunk, the storage controller controlling data storage on the array storage elements; and storing a portion of the second ECC chunk and associated second parity data on (N+P)−Z number of storage elements, wherein $1 \leq Z \leq P$ and Z comprises a number of unavailable storage elements.

* * * * *

UNITED STATES PATENT AND TRADEMARK OFFICE
CERTIFICATE OF CORRECTION

PATENT NO. : 8,307,258 B2
APPLICATION NO. : 12/468040
DATED : November 6, 2012
INVENTOR(S) : David Flynn et al.

It is certified that error appears in the above-identified patent and that said Letters Patent is hereby corrected as shown below:

On the Title page:

Item 73, Assignee: "Fusion-10, Inc." should read --Fusion-io, Inc.--

Signed and Sealed this
Eighteenth Day of December, 2012

David J. Kappos
*Director of the United States Patent and Trademark Office*